(12) United States Patent
Tao et al.

(10) Patent No.: US 10,937,516 B2
(45) Date of Patent: Mar. 2, 2021

(54) SHIFT REGISTER AND DRIVING METHOD THEREOF, GATE DRIVE CIRCUIT AND DISPLAY DEVICE

(71) Applicants: Hefei BOE Optoelectronics Technology Co., Ltd., Anhui (CN); BOE Technology Group Co., Ltd., Beijing (CN)

(72) Inventors: Jian Tao, Beijing (CN); Fengjing Tang, Beijing (CN); Zhaoke Zhang, Beijing (CN); Hongmin Li, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/486,971

(22) PCT Filed: Jan. 23, 2019

(86) PCT No.: PCT/CN2019/072755
§ 371 (c)(1),
(2) Date: Aug. 19, 2019

(87) PCT Pub. No.: WO2019/214294
PCT Pub. Date: Nov. 14, 2019

(65) Prior Publication Data
US 2020/0357479 A1 Nov. 12, 2020

(30) Foreign Application Priority Data
May 10, 2018 (CN) .......................... 201810445046.2

(51) Int. Cl.
*G11C 19/28* (2006.01)
*G09G 3/20* (2006.01)

(52) U.S. Cl.
CPC ............. *G11C 19/287* (2013.01); *G09G 3/20* (2013.01); *G09G 2310/0286* (2013.01); *G09G 2310/0291* (2013.01); *G09G 2310/08* (2013.01)

(58) Field of Classification Search
CPC ................... G11C 19/287; G09G 3/20; G09G 2310/0286; G09G 2310/0291; G09G 2310/08
See application file for complete search history.

(56) References Cited

U.S. PATENT DOCUMENTS 10,049,639 B2 * 8/2018 Gong ..................... G11C 19/28
2007/0047691 A1 3/2007 Tseng et al.
(Continued)

FOREIGN PATENT DOCUMENTS

CN 104282255 A 1/2015
CN 104409054 A 3/2015
(Continued)

*Primary Examiner* — Peter D McLoone
(74) *Attorney, Agent, or Firm* — Myers Bigel, P.A.

(57) ABSTRACT

A shift register and a driving method thereof, a gate drive circuit and a display device are provided. The shift register may comprise a transmission sub-circuit, a storage sub-circuit and an output control sub-circuit. The shift register may further comprise an output buffer sub-circuit and a reset sub-circuit. The gate drive circuit may comprise a plurality of cascaded shift registers as described above. The display device may comprise the gate drive circuit. The present disclosure guarantees the working stability, use reliability and display effect of a display panel.

20 Claims, 9 Drawing Sheets

(56) References Cited

U.S. PATENT DOCUMENTS

2016/0188074 A1\* 6/2016 Xiao .................. G06F 3/0412
                                                    345/173
2016/0343323 A1   11/2016 Xiao
2018/0166039 A1\* 6/2018 Gong .................. G09G 3/3696

FOREIGN PATENT DOCUMENTS

| CN | 107146568 A | 9/2017 |
| CN | 107845403 A | 3/2018 |
| CN | 108320708 A | 7/2018 |
| WO | 2019/010952 A1 | 1/2019 |

\* cited by examiner

In an input phase, the transmission sub-circuit provides a signal of a first input terminal or a second input terminal to the first node under the control of the first signal terminal and the second signal terminal, the storage sub-circuit provides a signal of the first power supply terminal or the second power supply terminal to the second node under the control of the first node, the first clock signal terminal and the second clock signal terminal ~ 100

In an output phase, the storage sub-circuit maintains the potential of the second node under the control of the second output terminal, the first clock signal terminal and the second clock signal terminal, and the output control sub-circuit provides the signal of the first power supply terminal or the second power supply terminal to the second output terminal under the control of the second node, and provides the signal of the first power supply terminal or the second power supply terminal to the first output terminal under the control of the second output terminal and the second clock signal terminal ~ 200

In a maintaining phase, the storage sub-circuit provides the signal of the first power supply terminal or the second power supply terminal to the second node under the control of the first node, the first clock signal terminal and the second clock signal terminal ~ 300

FIG. 10

SHIFT REGISTER AND DRIVING METHOD THEREOF, GATE DRIVE CIRCUIT AND DISPLAY DEVICE

CROSS REFERENCE TO RELATED APPLICATIONS

The present application is a 35 U.S.C. 371 national stage application of PCT International Application No. PCT/CN2019/072755, filed on Jan. 23, 2019, which claims the benefit of Chinese Patent Application No. 201810445046.2, filed on May 10, 2018, the entire disclosures of which are incorporated herein by reference.

FIELD

The exemplary embodiments of the present disclosure relate to the field of display technology, and more particularly to a shift register and a driving method thereof, a gate drive circuit and a display device.

BACKGROUND

In recent years, a panel display, such as a thin film transistor-liquid crystal display (TFT-LCD) and an active matrix organic light emitting diode (AMOLED), is widely applied in electronic products like TVs and mobile phones due to its advantages of light weight, thin thickness and low power consumption.

With the development of display technology, a display panel with high resolution and narrow frame has become the development trend. As a result, a gate driver on array (GOA) technology came into being. The GOA technology directly integrates a gate drive circuit of the display panel onto an array substrate to replace an external driver chip, which has the advantages of low cost, less processes and high productivity. The gate drive circuit is usually realized by shift registers, which convert a clock signal into on/off voltages and output them to various gate lines of the display panel respectively. Each gate line is usually connected with a shift register (namely, a level of the shift registers). Line-by-line scanning of pixels in the display panel is accomplished by enabling various shift registers to sequentially output the on voltage in turn.

SUMMARY

According to a first aspect of the present disclosure, the embodiment of the present disclosure provides a shift register. The shift register may comprise a transmission sub-circuit, a storage sub-circuit and an output control sub-circuit. The transmission sub-circuit is connected with a first signal terminal, a second signal terminal, a first input terminal, a second input terminal and a first node, and is configured to provide a signal of the first input terminal or the second input terminal to the first node under the control of the first signal terminal and the second signal terminal. The storage sub-circuit is connected with the first node, a second node, a first power supply terminal, a second power supply terminal, a first clock signal terminal and a second clock signal terminal, and is configured to provide a signal of the first power supply terminal or the second power supply terminal to the second node under the control of the first node, the first clock signal terminal and the second clock signal terminal, and maintain the potential of the second node under the control of a second output terminal, the first clock signal terminal and the second clock signal terminal. The output control sub-circuit is connected with the second node, the first power supply terminal, the second power supply terminal, the second clock signal terminal, a first output terminal and the second output terminal, and is configured to provide a signal of the first power supply terminal or the second power supply terminal to the second output terminal under the control of the second node, and provide a signal of the first power supply terminal or the second power supply terminal to the first output terminal under the control of the second output terminal and the second clock signal terminal.

Optionally, the shift register provided by the exemplary embodiment of the present disclosure may also comprise an output buffer sub-circuit and a reset sub-circuit. The output buffer sub-circuit is connected with a third node, the first output terminal, the first power supply terminal and the second power supply terminal, and is configured to output a signal of the first power supply terminal or the second power supply terminal to the first output terminal under the control of the third node. The output buffer sub-circuit is connected with the output control sub-circuit through the third node. The reset sub-circuit is connected with the second node, the second power supply terminal and a reset signal terminal, and is configured to provide a signal of the second power supply terminal to the second node under the control of the reset signal terminal.

Optionally, the transmission sub-circuit may comprise a first transistor, a first sub-transistor, a second transistor and a second sub-transistor. The control electrode of the first transistor is connected with the first signal terminal, the first electrode of the first transistor is connected with the first input terminal, and the second electrode of the first transistor is connected with the first node. The control electrode of the first sub-transistor is connected with the second signal terminal, the first electrode of the first sub-transistor is connected with the first input terminal, and the second electrode of the first sub-transistor is connected with the first node. The control electrode of the second transistor is connected with the first signal terminal, the first electrode of the second transistor is connected with the first node, and the second electrode of the second transistor is connected with the second input terminal. The control electrode of the second sub-transistor is connected with the second signal terminal, the first electrode of the second sub-transistor is connected with the second node, and the second electrode of the second sub-transistor is connected with the second input terminal. The first transistor and the first sub-transistor are of opposite types, the first transistor and the second sub-transistor are of the same type, and the second transistor and the first sub-transistor are of the same type.

Optionally, the storage sub-circuit may comprise: a third transistor, a fourth transistor, a fifth transistor, a fifth sub-transistor, a sixth transistor, a sixth sub-transistor, an eighth transistor, and a ninth transistor. The control electrode of the third transistor is connected with the first node, the first electrode of the third transistor is connected with the first power supply terminal, and the second electrode of the third transistor is connected with the first electrode of the fourth transistor. The control electrode of the fourth transistor is connected with the first node, the first electrode of the fourth transistor is connected with the first electrode of the fifth transistor, and the second electrode of the fourth transistor is connected with the second power supply terminal. The control electrode of the fifth transistor is connected with the second clock signal terminal, the first electrode of the fifth transistor is connected with the first electrode of the fifth sub-transistor, and the second electrode of the fifth transistor is connected with the second electrode of the fifth sub-transistor. The control electrode of the fifth sub-transistor is connected with the first clock signal terminal, and the second electrode of the fifth sub-transistor is connected with the second node. The control electrode of the sixth transistor is connected with the second clock signal terminal, the first electrode of the sixth transistor is connected with the second node, and the second electrode of the sixth transistor is connected with the second electrode of the eighth transistor. The control electrode of the sixth sub-transistor is connected with the first clock signal terminal, the first electrode of the sixth sub-transistor is connected with the second node, and the second electrode of the sixth sub-transistor is connected with the second electrode of the eighth transistor. The control electrode of the eighth transistor is connected with the second output terminal, the first electrode of the eighth transistor is connected with the first power supply terminal, and the second electrode of the eighth transistor is connected with the first electrode of the ninth transistor. The control electrode of the ninth transistor is connected with the second output terminal, and the second electrode of the ninth transistor is connected with the second power supply terminal. The fifth transistor and the fifth sub-transistor are of opposite types, the fifth transistor and the sixth sub-transistor are of the same type, the sixth transistor and the fifth sub-transistor are of the same type, the third transistor and the fourth transistor are of opposite types, and the eighth transistor and the ninth transistor are of opposite types.

Optionally, the output control sub-circuit may comprise a tenth transistor, an eleventh transistor, a twelfth transistor, a thirteenth transistor, a fourteenth transistor, and a fifteenth transistor. The control electrode of the tenth transistor is connected with the second node, the first electrode of the tenth transistor is connected with the first power supply terminal, and the second electrode of the tenth transistor is connected with the second output terminal. The control electrode of the eleventh transistor is connected with the second node, the first electrode of the eleventh transistor is connected with the second output terminal, and the second electrode of the eleventh transistor is connected with the second power supply terminal. The control electrode of the twelfth transistor is connected with the second output terminal, the first electrode of the twelfth transistor is connected with the first output terminal, and the second electrode of the twelfth transistor is connected with the first electrode of the thirteenth transistor. The control electrode of the thirteenth transistor is connected with the second clock signal terminal, and the second electrode of the thirteenth transistor is connected with the second power supply terminal. The control electrode of the fourteenth transistor is connected with the second output terminal, the first electrode of the fourteenth transistor is connected with the first power supply terminal, and the second electrode of the fourteenth transistor is connected with the first output terminal. The control electrode of the fifteenth transistor is connected with the second clock signal terminal, the first electrode of the fifteenth transistor is connected with the first power supply terminal, and the second electrode of the fifteenth transistor is connected with the first output terminal. The tenth transistor and the eleventh transistor are of opposite types, the fourteenth transistor and the fifteenth transistor are of the same type, the twelfth transistor and the thirteenth transistor are of the same type, and the twelfth transistor and the fourteenth transistor are of opposite types.

Optionally, the reset sub-circuit may comprise a seventh transistor. The control electrode of the seventh transistor is connected with the reset signal terminal, the first electrode of the seventh transistor is connected with the second node, and the second electrode of the seventh transistor is connected with the second power supply terminal.

Optionally, the output buffer sub-circuit may comprise: a sixteenth transistor, a seventeenth transistor, an eighteenth transistor, a nineteenth transistor, a twentieth transistor, and a twenty-first transistor. The control electrode of the sixteenth transistor is connected with the third node, the first electrode of the sixteenth transistor is connected with the first power supply terminal, and the second electrode of the sixteenth transistor is connected with the first electrode of the seventeenth transistor. The control electrode of the seventeenth transistor is connected with the third node, the first electrode of the seventeenth transistor is connected with the control electrode of the eighteenth transistor, and the second electrode of the seventeenth transistor is connected with the second power supply terminal. The control electrode of the eighteenth transistor is connected with the control electrode of the nineteenth transistor, the first electrode of the eighteenth transistor is connected with the first power supply terminal, and the second electrode of the eighteenth transistor is connected with the first electrode of the nineteenth transistor. The first electrode of the nineteenth transistor is connected with the control electrode of the twentieth transistor, and the second electrode of the nineteenth transistor is connected with the second power supply terminal. The control electrode of the twentieth transistor is connected with the control electrode of the twenty-first transistor, the first electrode of the twentieth transistor is connected with the first power supply terminal, and the second electrode of the twentieth transistor is connected with the first output terminal. The first electrode of the twenty-first transistor is connected with the first output terminal, and the second electrode of the twenty-first transistor is connected with the second power supply terminal. The sixteenth transistor, the eighteenth transistor, and the twentieth transistor are of the same type, the seventeenth transistor, the nineteenth transistor, and the twenty-first transistor are of the same type, and the sixteenth transistor and the seventeenth transistor are of opposite types.

Optionally, the shift register may further comprise an output buffer sub-circuit and a reset sub-circuit. The transmission sub-circuit comprises a first transistor, a first sub-transistor, a second transistor, and a second sub-transistor. The storage sub-circuit comprises a third transistor, a fourth transistor, a fifth transistor, a fifth sub-transistor, a sixth transistor, a sixth sub-transistor, an eighth transistor, and a ninth transistor. The output control sub-circuit comprises a tenth transistor, an eleventh transistor, a twelfth transistor, a thirteenth transistor, a fourteenth transistor, and a fifteenth transistor. The reset sub-circuit comprises a seventh transistor. The output buffer sub-circuit comprises a sixteenth transistor, a seventeenth transistor, an eighteenth transistor, a nineteenth transistor, a twentieth transistor, and a twenty-first transistor. The control electrode of the first transistor is connected with the first signal terminal, the first electrode of the first transistor is connected with the first input terminal, and the second electrode of the first transistor is connected with the first node. The control electrode of the first sub-transistor is connected with the second signal terminal, the first electrode of the first sub-transistor is connected with the first input terminal, and the second electrode of the first sub-transistor is connected with the first node. The control electrode of the second transistor is connected with the first signal terminal, the first electrode of the second transistor is connected with the first node, and the second electrode of the second transistor is connected with the second input terminal. The control electrode of the second sub-transistor is connected with the second signal terminal, the first electrode of the second sub-transistor is connected with the second node, and the second electrode of the second sub-transistor is connected with the second input terminal. The control electrode of the third transistor is connected with the first node, the first electrode of the third transistor is connected with the first power supply terminal, and the second electrode of the third transistor is connected with the first electrode of the fourth transistor. The control electrode of the fourth transistor is connected with the first node, the first electrode of the fourth transistor is connected with the first electrode of the fifth transistor, and the second electrode of the fourth transistor is connected with the second power supply terminal. The control electrode of the fifth transistor is connected with the second clock signal terminal, the first electrode of the fifth transistor is connected with the first electrode of the fifth sub-transistor, and the second electrode of the fifth transistor is connected with the second electrode of the fifth sub-transistor. The control electrode of the fifth sub-transistor is connected with the first clock signal terminal, and the second electrode of the fifth sub-transistor is connected with the second node. The control electrode of the sixth transistor is connected with the second clock signal terminal, the first electrode of the sixth transistor is connected with the second node, and the second electrode of the sixth transistor is connected with the second electrode of the eighth transistor. The control electrode of the sixth sub-transistor is connected with the first clock signal terminal, the first electrode of the sixth sub-transistor is connected with the second node, and the second electrode of the sixth sub-transistor is connected with the second electrode of the eighth transistor. The control electrode of the eighth transistor is connected with the second output terminal, the first electrode of the eighth transistor is connected with the first power supply terminal, and the second electrode of the eighth transistor is connected with the first electrode of the ninth transistor. The control electrode of the ninth transistor is connected with the second output terminal, and the second electrode of the ninth transistor is connected with the second power supply terminal. The control electrode of the tenth transistor is connected with the second node, the first electrode of the tenth transistor is connected with the first power supply terminal, and the second electrode of the tenth transistor is connected with the second output terminal. The control electrode of the eleventh transistor is connected with the second node, the first electrode of the eleventh transistor is connected with the second output terminal, and the second electrode of the eleventh transistor is connected with the second power supply terminal. The control electrode of the twelfth transistor is connected with the second output terminal, the first electrode of the twelfth transistor is connected with the third node, and the second electrode of the twelfth transistor is connected with the first electrode of the thirteenth transistor. The control electrode of the thirteenth transistor is connected with the second clock signal terminal, and the second electrode of the thirteenth transistor is connected with the second power supply terminal. The control electrode of the fourteenth transistor is connected with the second output terminal, the first electrode of the fourteenth transistor is connected with the first power supply terminal, and the second electrode of the fourteenth transistor is connected with the third node. The control electrode of the fifteenth transistor is connected with the second clock signal terminal, the first electrode of the fifteenth transistor is connected with the first power supply terminal, and the second electrode of the fifteenth transistor is connected with the third node. The control electrode of the seventh transistor is connected with the reset signal terminal, the first electrode of the seventh transistor is connected with the second node, and the second electrode of the seventh transistor is connected with the second power supply terminal. The control electrode of the sixteenth transistor is connected with the third node, the first electrode of the sixteenth transistor is connected with the first power supply terminal, and the second electrode of the sixteenth transistor is connected with the first electrode of the seventeenth transistor. The control electrode of the seventeenth transistor is connected with the third node, the first electrode of the seventeenth transistor is connected with the control electrode of the eighteenth transistor, and the second electrode of the seventeenth transistor is connected with the second power supply terminal. The control electrode of the eighteenth transistor is connected with the control electrode of the nineteenth transistor, the first electrode of the eighteenth transistor is connected with the first power supply terminal, and the second electrode of the eighteenth transistor is connected with the first electrode of the nineteenth transistor. The first electrode of the nineteenth transistor is connected with the control electrode of the twentieth transistor, and the second electrode of the nineteenth transistor is connected with the second power supply terminal. The control electrode of the twentieth transistor is connected with the control electrode of the twenty-first transistor, the first electrode of the twentieth transistor is connected with the first power supply terminal, and the second electrode of the twentieth transistor is connected with the first output terminal. The first electrode of the twenty-first transistor is connected with the first output terminal, and the second electrode of the twenty-first transistor is connected with the second power supply terminal.

According to a second aspect of the present disclosure, the exemplary embodiment of the present disclosure further provides a gate drive circuit. The gate drive circuit may comprise a plurality of cascaded shift registers as described above. The first input terminal of an (N+1)th shift register is connected with the second output terminal of an N-th shift register, and the second output terminal of the (N+1)th shift register is connected with the second input terminal of the N-th shift register, wherein N is a positive integer.

According to a third aspect of the present disclosure, the exemplary embodiment of the present disclosure further provides a display device. The display device may comprise the gate drive circuit as described above.

According to a fourth aspect of the present disclosure, the exemplary embodiment of the present disclosure further provides a driving method of a shift register, which is applied to the shift register as described above. The method may comprise: in an input phase, the transmission sub-circuit provides a signal of the first input terminal or the second input terminal to the first node under the control of the first signal terminal and the second signal terminal, the storage sub-circuit provides a signal of the first power supply terminal or the second power supply terminal to the second node under the control of the first node, the first clock signal terminal and the second clock signal terminal; in an output phase, the storage sub-circuit maintains the potential of the second node under the control of the second output terminal, the first clock signal terminal and the second clock signal terminal, and the output control sub-circuit provides the signal of the first power supply terminal or the second power supply terminal to the second output terminal under the control of the second node, and provides the signal of the first power supply terminal or the second power supply terminal to the first output terminal under the control of the second output terminal and the second clock signal terminal; and in a maintaining phase, the storage sub-circuit provides the signal of the first power supply terminal or the second power supply terminal to the second node under the control of the first node, the first clock signal terminal and the second clock signal terminal.

Optionally, the method may further comprise: in an initialization phase, the reset sub-circuit provides the signal of the second power supply terminal to the second node under the control of a reset signal terminal.

Optionally, the method may further comprise: in an output phase, the output buffer sub-circuit outputs the signal of the first power supply terminal or the second power supply terminal to the first output terminal under the control of the third node.

BRIEF DESCRIPTION OF DRAWINGS

Drawings are used to provide further understanding of the technical solutions of the present disclosure, constitute a part of the description, and explain, together with the exemplary embodiments of the present application, the technical solutions of the present disclosure, and do not constitute a limitation to the technical solutions of the present application.

FIG. 10 is a flow chart of a driving method of a shift register provided by an exemplary embodiment of the present disclosure;

DETAILED DESCRIPTION

Figure 1:
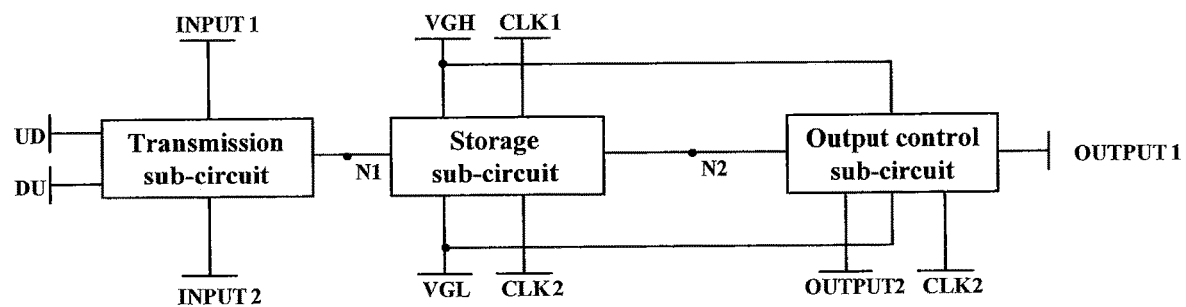
FIG. 1 is a structural schematic view of a shift register provided by an exemplary embodiment of the present disclosure.

In order to clarify the object, technical solutions and advantages of the present disclosure more clearly, the exemplary embodiments of the present disclosure will be described in detail with reference to the drawings. It shall be explained that the exemplary embodiments and the features thereof in the present application can be combined arbitrarily in the case of no conflict.

The steps illustrated in the flow chart of the drawings may be executed in a computer system in the form of a set of computer executable instructions. Additionally, although a logical sequence is shown in the flow chart, in some cases, the steps shown or described may be performed in an order different from the one described herein.

Unless otherwise defined, the technical and scientific terms used in the exemplary embodiment of the present disclosure shall have the ordinary meanings as understood by those ordinarily skilled in the art to which the present disclosure belongs. The terms "first," "second," and the like, which are used in the present disclosure, are not intended to indicate any sequence, amount or importance, but distinguish various components. The term "comprise" or "include" and the like mean that the element or object stated before the term encompasses the elements or the objects and equivalents thereof enumerated thereafter, but do not preclude other elements or objects. The phrase "connect" or "connected" and the like are not limited to a physical or mechanical connection, but may include an electrical connection, directly or indirectly.

Those skilled in the art may understand that the transistors employed in all exemplary embodiments of the present application may be thin film transistors or field effect transistors or other devices with the same characteristics. For example, the thin film transistor used in the exemplary embodiment of the present disclosure may be an oxide semiconductor transistor. Because the source and drain of the transistor used herein are symmetrical, the source and drain of the transistor may be exchanged. In the exemplary embodiment of the present disclosure, in order to distinguish the two electrodes of a transistor except the gate, one electrode is called the first electrode and the other electrode is called the second electrode. The first electrode may be a source or drain, and the second electrode may be a drain or source. In addition, the gate of the transistor is called the control electrode in the embodiment of the present disclosure.

The inventor found through researches that the existing shift register has the technical problems of failure to achieve a bidirectional scanning function, and poor circuit stability, which reduces the working stability, use reliability and display effect of a display panel.

In order to solve the above technical problems, the present disclosure provides a shift register and a driving method thereof, a gate drive circuit and a display device, which not only realizes the bidirectional scanning of the shift register, but also improves the stability of the circuit, and ensures the working stability, use reliability and display effect of a display panel.

The exemplary embodiment of the present disclosure provides a shift register and a driving method thereof, a gate drive circuit and a display device. The technical solution provided by the exemplary embodiment of the present disclosure arranges a transmission sub-circuit to realize the bidirectional scanning of the shift register, and arranges a storage sub-circuit to improve the stability of the circuit, and guarantee the work stability, use reliability and display effect of a display panel.

Of course, any product or method implementing the present disclosure does not necessarily need to achieve all the advantages described above at the same time. Other features and advantages of the present disclosure will be described subsequently in the exemplary embodiments of the description, and become apparent in part from the exemplary embodiments of the description, or be understood by implementing the present disclosure. The object and other advantages of the embodiments of the present disclosure may be achieved and acquired by means of the structure specifically indicated in the specification, claims and drawings.

FIG. 1 is a structural schematic view of a shift register provided by an exemplary embodiment of the present disclosure. As shown in FIG. 1, the shift register provided by the exemplary embodiment of the present disclosure comprises a transmission sub-circuit, a storage sub-circuit and an output control sub-circuit.

The transmission sub-circuit is connected with a first signal terminal UD, a second signal terminal DU, a first input terminal INPUT1, a second input terminal INPUT2 and a first node N1, and is configured to provide a signal of the first input terminal INPUT1 or the second input terminal INPUT2 to the first node N1 under the control of the first signal terminal UD and the second signal terminal DU.

The storage sub-circuit is connected with the first node N1, a second node N2, a first power supply terminal VGH, a second power supply terminal VGL, a first clock signal terminal CLK1 and a second clock signal terminal CLK2, and is configured to provide a signal of the first power supply terminal VGH or the second power supply terminal VGL to the second node N2 under the control of the first node N1, the first clock signal terminal CLK1 and the second clock signal terminal CLK2. Additionally, the storage sub-circuit is also configured to maintain the potential of the second node N2 under the control of a second output terminal OUTPUT2, the first clock signal terminal CLK1 and the second clock signal terminal CLK2.

The output control sub-circuit is connected with the second node N2, the first power supply terminal VGH, the second power supply terminal VGL, the second clock signal terminal CLK2, a first output terminal OUTPUT1 and the second output terminal OUTPUT2, and is configured to provide a signal of the first power supply terminal VGH or the second power supply terminal VGL to the second output terminal OUTPUT2 under the control of the second node N2. Additionally, the output control sub-circuit is also configured to provide a signal of the first power supply terminal VGH or the second power supply terminal VGL to the first output terminal OUTPUT1 under the control of the second output terminal OUTPUT2 and the second clock signal terminal CLK2.

In an exemplary embodiment, the first output terminal OUTPUT1 provides a gate drive signal for the shift register in the present stage, the second output terminal OUTPUT2 is connected with the first output terminal of a shift register in the next stage, and the second input terminal INPUT2 is connected with the second output terminal of the shift register in the next stage.

In an exemplary embodiment, the first power supply terminal VGH continuously provides a high potential signal, and the second power supply terminal VGL continuously provides a low potential signal. The potentials of the first signal terminal UD and the second signal terminal DU are switched with forward and backward scannings. In the forward scanning, the first signal terminal UD is equivalent to a high DC potential, and the second signal terminal DU is equivalent to a low DC potential; and in the backward scanning, the first signal terminal UD is equivalent to a low DC potential, and the second signal terminal DU is equivalent to a high DC potential.

The shift register provided by an exemplary embodiment of the present disclosure comprises: a transmission sub-circuit that is connected with a first signal terminal, a second signal terminal, a first input terminal, a second input terminal and a first node, and is configured to provide a signal of the first input terminal or the second input terminal to the first node under the control of the first signal terminal and the second signal terminal; a storage sub-circuit that is connected with the first node, a second node, a first power supply terminal, a second power supply terminal, a first clock signal terminal and a second clock signal terminal, and is configured to provide a signal of the first power supply terminal or the second power supply terminal to the second node under the control of the first node, the first clock signal terminal and the second clock signal terminal, and maintain the potential of the second node under the control of a second output terminal, the first clock signal terminal and the second clock signal terminal; an output control sub-circuit that is connected with the second node, the first power supply terminal, the second power supply terminal, the second clock signal terminal, a first output terminal and the second output terminal, and is configured to provide a signal of the first power supply terminal or the second power supply terminal to the second output terminal under the control of the second node, and provide a signal of the first power supply terminal or the second power supply terminal to the first output terminal under the control of the second output terminal and the second clock signal terminal. The technical solution provided by the exemplary embodiment of the present disclosure arranges the transmission sub-circuit to realize the bidirectional scanning of the shift register, and arranges the storage sub-circuit to store cascaded signals so as to improve the stability of the circuit, and guarantee the work stability, use reliability and display effect of a display panel.

Figure 2:
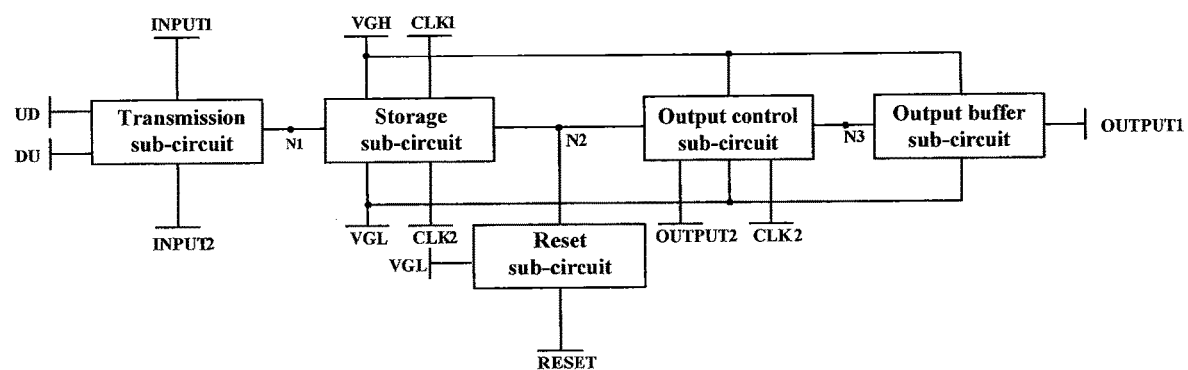
FIG. 2 is a structural schematic view of a shift register provided by another exemplary embodiment of the present disclosure.

FIG. 2 is a structural schematic view of a shift register provided by another exemplary embodiment of the present disclosure. As shown in FIG. 2, apart from the transmission sub-circuit, the storage sub-circuit and the output control sub-circuit shown in FIG. 1, the shift register provided by the exemplary embodiment of the present disclosure comprises an output buffer sub-circuit and a reset sub-circuit.

The output buffer sub-circuit is connected with a third node N3, the first output terminal OUTPUT1, the first power supply terminal VGH and the second power supply terminal VGL, and is configured to output a signal of the first power supply terminal VGH or the second power supply terminal VGL to the first output terminal OUTPUT1 under the control of the third node N3.

The output buffer sub-circuit is disposed between the output control sub-circuit and the first output terminal OUTPUT1. The output buffer sub-circuit is connected with the output control sub-circuit through the third node N3.

In the exemplary embodiment, the output buffer sub-circuit is arranged to adjust a scanning signal adjusted by the time sequence to enhance the load-carrying capacity.

The reset sub-circuit is connected with the second node N2, the second power supply terminal VGL and the reset signal terminal RESET, and is configured to provide a signal of the second power supply terminal VGL to the second node N2 under the control of the reset signal terminal RESET.

In the exemplary embodiment, the reset signal terminal RESET is configured to receive the reset signal so as to discharge the second node, thereby pulling down the potential of the second node for setting high the output of the shift register in the present stage.

In the exemplary embodiment of the present disclosure, by setting the reset sub-circuit in the shift register in each stage, when the input signal of the reset signal terminal RESET of the shift register in each stage is at a high level at the same time, the outputs of the whole gate drive circuit are set high, so that the pixel thin film transistors (TFT) in the display area are fully opened, and the residual charge in the pixel is released through a source line for realizing pixel discharge.

Figure 3:
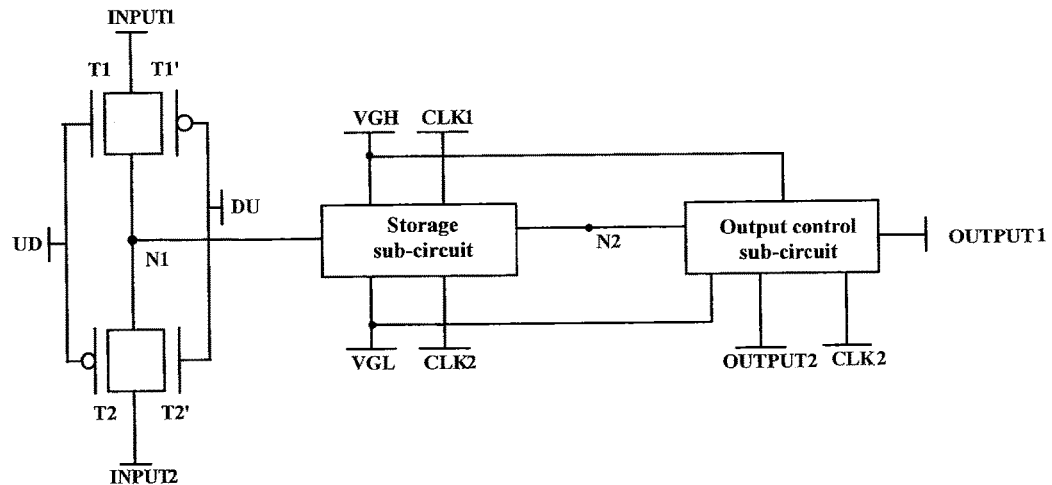
FIG. 3 is an equivalent circuit diagram of a transmission sub-circuit provided by an exemplary embodiment of the present disclosure.

FIG. 3 is an equivalent circuit diagram of a transmission sub-circuit provided by an exemplary embodiment of the present disclosure. As shown in FIG. 3, the transmission sub-circuit provided by the exemplary embodiment of the present disclosure may comprise a first transistor T1, a first sub-transistor T1', a second transistor T2 and a second sub-transistor T2'.

The control electrode of the first transistor T1 is connected with the first signal terminal UD, the first electrode of the first transistor T1 is connected with the first input terminal INPUT1, and the second electrode of the first transistor T1 is connected with the first node N1; the control electrode of the first sub-transistor T1' is connected with the second signal terminal DU, the first electrode of the first sub-transistor T1' is connected with the first input terminal INPUT1, and the second electrode of the first sub-transistor T1' is connected with the first node N1; the control electrode of the second transistor T2 is connected with the first signal terminal UD, the first electrode of the second transistor T2 is connected with the first node N1, and the second electrode of the second transistor T2 is connected with the second input terminal INPUT2; the control electrode of the second sub-transistor T2' is connected with the second signal terminal DU, the first electrode of the second sub-transistor T2' is connected with the second node N2, and the second electrode of the second sub-transistor T2' is connected with the second input terminal INPUT2.

In the present exemplary embodiment, the first transistor T1 and the first sub-transistor T1' are of opposite types, the first transistor T1 and the second sub-transistor T2' are of the same type, and the second transistor T2 and the first sub-transistor T1' are of the same type. FIG. 3 makes an explanation by taking, for example, the first transistor T1 and the second sub-transistor T2' as N-type thin film transistors and the second transistor T2 and the first sub-transistor T1' as P-type thin film transistors.

The first transistor T1 and the first sub-transistor T1' constitute a forward transmission gate. When the first signal terminal UD is equivalent to a high DC potential and the second signal terminal DU is equivalent to a low DC potential, during a forward scanning, the forward transmission gate operates to transmit the signal of the first signal terminal INPUT1 to the first node. The second transistor T2 and the second sub-transistor T2' constitute a backward transmission gate. When the first signal terminal UD is equivalent to a low DC potential and the second signal terminal DU is equivalent to a high DC potential, during a backward scanning, the backward transmission gate operates to transmit the signal of the second signal terminal INPUT2 to the first node.

It needs to be explained that FIG. 3 shows the exemplary structure of the transmission sub-circuit. Those skilled in the art can readily understand that the implementation of the sub-circuit is not limited thereto, and may be any implementation as long as the respective functions can be realized.

Figure 4:
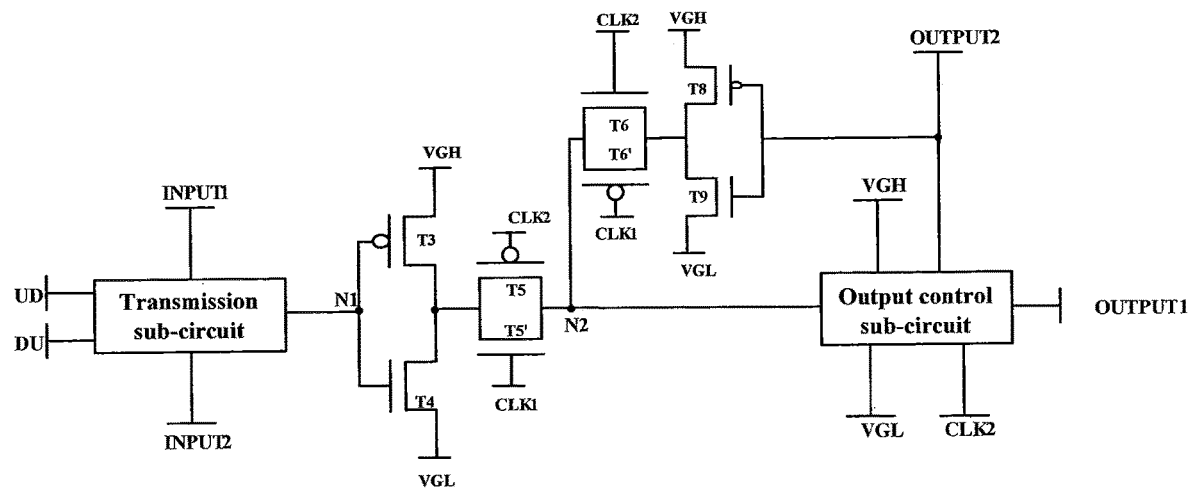
FIG. 4 is an equivalent circuit diagram of a storage sub-circuit provided by an exemplary embodiment of the present disclosure.

FIG. 4 is an equivalent circuit diagram of a storage sub-circuit provided by an exemplary embodiment of the present disclosure. As shown in FIG. 4, the storage sub-circuit provided by the exemplary embodiment of the present disclosure may comprise: a third transistor T3, a fourth transistor T4, a fifth transistor T5, a fifth sub-transistor T5', a sixth transistor T6, a sixth sub-transistor T6', an eighth transistor T8, and a ninth transistor T9.

The control electrode of the third transistor T3 is connected with the first node N1, the first electrode of the third transistor T3 is connected with the first power supply terminal VGH, and the second electrode of the third transistor T3 is connected with the first electrode of the fourth transistor T4; the control electrode of the fourth transistor T4 is connected with the first node N1, the first electrode of the fourth transistor T4 is connected with the first electrode of the fifth transistor T5, and the second electrode of the fourth transistor T4 is connected with the second power supply terminal VGL; the control electrode of the fifth transistor T5 is connected with the second clock signal terminal CLK2, the first electrode of the fifth transistor T5 is connected with the first electrode of the fifth sub-transistor T5', and the second electrode of the fifth transistor T5 is connected with the second electrode of the fifth sub-transistor T5'; the control electrode of the fifth sub-transistor T5' is connected with the first clock signal terminal CLK1, and the second electrode of the fifth sub-transistor T5' is connected with the second node N2; the control electrode of the sixth transistor T6 is connected with the second clock signal terminal CLK2, the first electrode of the sixth transistor T6 is connected with the second node N2, and the second electrode of the sixth transistor T6 is connected with the second electrode of the eighth transistor T8; the control electrode of the sixth sub-transistor T6' is connected with the first clock signal terminal CLK1, the first electrode of the sixth sub-transistor T6' is connected with the second node N2, and the second electrode of the sixth sub-transistor T6' is connected with the second electrode of the eighth transistor T8; the control electrode of the eighth transistor T8 is connected with the second output terminal OUTPUT2, the first electrode of the eighth transistor T8 is connected with the first power supply terminal VGH, and the second electrode of the eighth transistor T8 is connected with the first electrode of the ninth transistor T9; the control electrode of the ninth transistor T9 is connected with the second output terminal OUTPUT2, and the second electrode of the ninth transistor T9 is connected with the second power supply terminal VGL.

In the present exemplary embodiment, the fifth transistor T5 and the fifth sub-transistor T5' are of opposite types, the fifth transistor T5 and the sixth sub-transistor T6' are of the same type, the sixth transistor T6 and the fifth sub-transistor T5' are of the same type, the third transistor T3 and the fourth transistor T4 are of opposite types, and the eighth transistor T8 and the ninth transistor T9 are of opposite types. FIG. 4 makes an explanation by taking, for example, the third transistor T3, the fifth transistor T5, the six sub-transistor T6' and the eight transistor T8 as P-type thin film transistors and the fourth transistor T4, the fifth sub-transistor T5', the sixth transistor T6 and the ninth transistor T9 as N-type thin film transistors.

The third transistor T3, the fourth transistor T4, the fifth transistor T5 and the fifth sub-transistor T5' constitute forward timing inverter. The forward sequential inverter is electrically connected with the first node N1. The sixth transistor T6, the sixth sub-transistor T6', the eighth transistor T8 and the ninth transistor T9 constitute backward timing inverter. The backward timing inverter is connected with the second node N2 and the forward timing inverter. It should be explained that in the exemplary embodiment, when the forward timing inverter is turned on, the backward timing inverter is turned off, and when the forward timing inverter is turned off, the backward timing inverter is turned on.

The storage sub-circuit in the exemplary embodiment avoids the use of capacitors, realizes the static storage of the shift register, and improves the stability of the circuit of the shift register.

It needs to be explained that FIG. 4 shows the exemplary structure of the storage sub-circuit. Those skilled in the art can readily understand that the implementation of the sub-circuit is not limited thereto, and may be any implementation as long as the respective functions can be realized.

Figure 5:
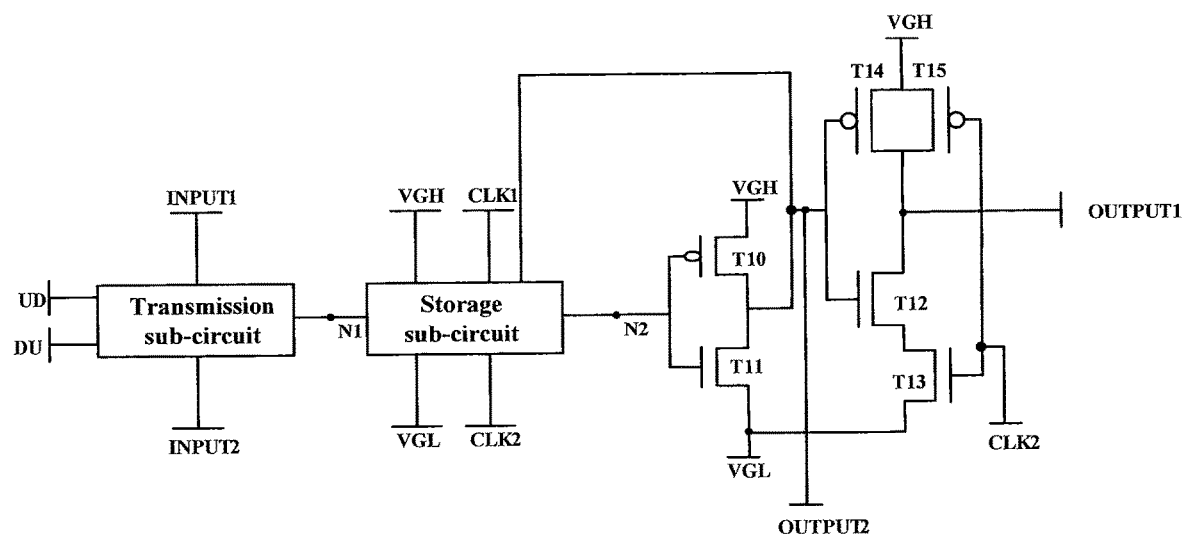
FIG. 5 is an equivalent circuit diagram of an output control sub-circuit provided by an exemplary embodiment of the present disclosure.

FIG. 5 is an equivalent circuit diagram of an output control sub-circuit provided by an exemplary embodiment of the present disclosure. As shown in FIG. 5, the output control sub-circuit provided by the exemplary embodiment of the present disclosure may comprise a tenth transistor T10, an eleventh transistor T11, a twelfth transistor T12, a thirteenth transistor T13, a fourteenth transistor T14, and a fifteenth transistor T15.

The control electrode of the tenth transistor T10 is connected with the second node N2, the first electrode of the tenth transistor T10 is connected with the first power supply terminal VGH, and the second electrode of the tenth transistor T10 is connected with the second output terminal OUTPUT2; the control electrode of the eleventh transistor T11 is connected with the second node N2, the first electrode of the eleventh transistor T11 is connected with the second output terminal OUTPUT2, and the second electrode of the eleventh transistor T11 is connected with the second power supply terminal VGL; the control electrode of the twelfth transistor T12 is connected with the second output terminal OUTPUT2, the first electrode of the twelfth transistor T12 is connected with the first output terminal OUTPUT1, and the second electrode of the twelfth transistor T12 is connected with the first electrode of the thirteenth transistor T13; the control electrode of the thirteenth transistor T13 is connected with the second clock signal terminal CLK2, and the second electrode of the thirteenth transistor T13 is connected with the second power supply terminal VGL; the control electrode of the fourteenth transistor T14 is connected with the second output terminal OUTPUT2, the first electrode of the fourteenth transistor T14 is connected with the first power supply terminal VGH, and the second electrode of the fourteenth transistor T14 is connected with the first output terminal OUTPUT1; the control electrode of the fifteenth transistor T15 is connected with the second clock signal terminal CLK2, the first electrode of the fifteenth transistor T15 is connected with the first power supply terminal VGH, and the second electrode of the fifteenth transistor T15 is connected with the first output terminal OUTPUT1.

In the exemplary embodiment, the tenth transistor T10 and the eleventh transistor T11 are of opposite types, the fourteenth transistor T14 and the fifteenth transistor T15 are of the same type, the twelfth transistor T12 and the thirteenth transistor T13 are of the same type, and the twelfth transistor T12 and the fourteenth transistor T14 are of opposite types. FIG. 5 makes an explanation by taking, for example, the tenth transistor T10, the fourteenth transistor T14, and the fifteenth transistor T15 as P-type thin film transistors and the eleventh transistor T11, the twelfth transistor T12 and the thirteenth transistor T13 as N-type transistors.

The tenth transistor T10 and the eleventh transistor T11 constitute an inverter, and the twelfth transistor T12, the thirteenth transistor T13, the fourteenth transistor T14 and the fifteenth transistor T15 constitute a NAND gate logic unit.

It needs to be explained that FIG. 5 shows the exemplary structure of the output control sub-circuit. Those skilled in the art can readily understand that the implementation of the sub-circuit is not limited thereto, and may be any implementation as long as the respective functions can be realized.

Figure 6:
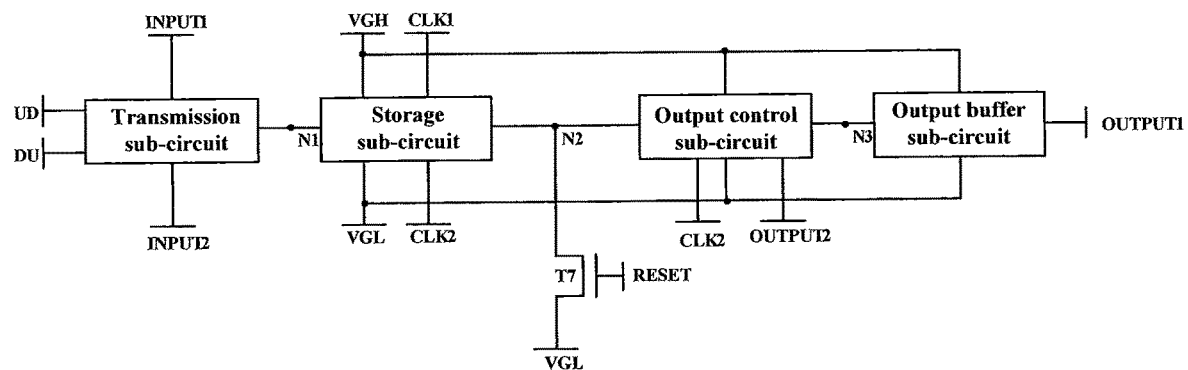
FIG. 6 is an equivalent circuit diagram of a reset sub-circuit provided by an exemplary embodiment of the present disclosure.

FIG. 6 is an equivalent circuit diagram of a reset sub-circuit provided by an exemplary embodiment of the present disclosure. As shown in FIG. 6, the reset sub-circuit provided by the exemplary embodiment of the present disclosure may comprise a seventh transistor T7.

The control electrode of the seventh transistor T7 is connected with the reset signal terminal RESET, the first electrode of the seventh transistor T7 is connected with the second node N2, and the second electrode of the seventh transistor T7 is connected with the second power supply terminal VGL.

In the exemplary embodiment, the seventh transistor T7 may be an N-type thin film transistor, or a P-type thin film transistor. FIG. 6 makes an explanation by taking, for example, the seventh transistor T7 as the N-type thin film transistor.

It needs to be explained that FIG. 6 shows the exemplary structure of the reset sub-circuit. Those skilled in the art can readily understand that the implementation of the sub-circuit is not limited thereto, and may be any implementation as long as the respective functions can be realized.

Figure 7:
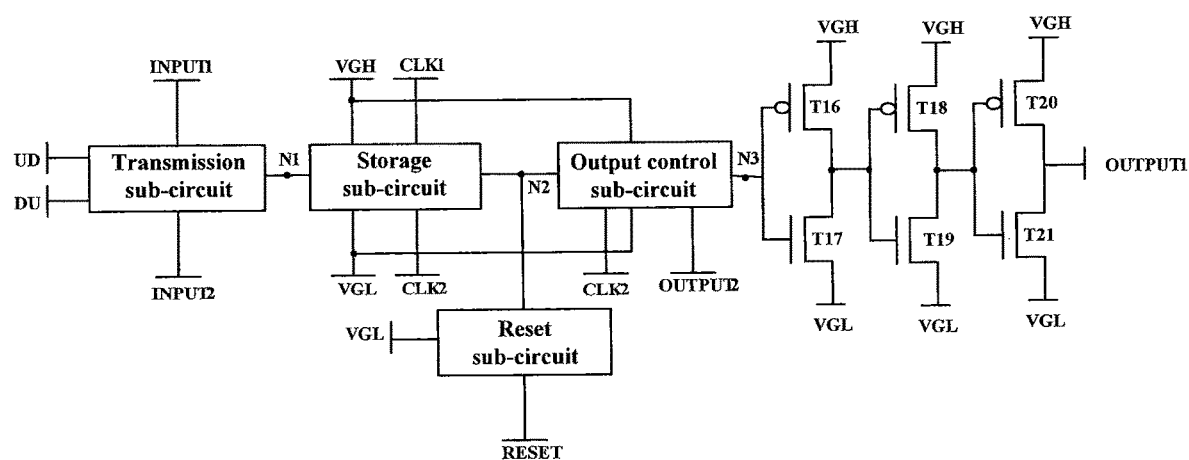
FIG. 7 is an equivalent circuit diagram of an output buffer sub-circuit provided by an exemplary embodiment of the present disclosure.

FIG. 7 is an equivalent circuit diagram of an output buffer sub-circuit provided by an exemplary embodiment of the present disclosure. As shown in FIG. 7, the output buffer sub-circuit provided by the exemplary embodiment of the present disclosure may comprise: a sixteenth transistor T16, a seventeenth transistor T17, an eighteenth transistor T18, a nineteenth transistor T19, a twentieth transistor T20, and a twenty-first transistor T21.

The control electrode of the sixteenth transistor T16 is connected with the third node N3; the first electrode of the sixteenth transistor T16 is connected with the first power supply terminal VGH, and the second electrode of the sixteenth transistor T16 is connected with the first electrode of the seventeenth transistor T17; the control electrode of the seventeenth transistor T17 is connected with the third node N3, the first electrode of the seventeenth transistor T17 is connected with the control electrode of the eighteenth transistor T18, and the second electrode of the seventeenth transistor T17 is connected with the second power supply terminal VGL; the control electrode of the eighteenth transistor T18 is connected with the control electrode of the nineteenth transistor T19, the first electrode of the eighteenth transistor T18 is connected with the first power supply terminal VGH, and the second electrode of the eighteenth transistor T18 is connected with the first electrode of the nineteenth transistor T19; the first electrode of the nineteenth transistor T19 is connected with the control electrode of the twentieth transistor T20, and the second electrode of the nineteenth transistor T19 is connected with the second power supply terminal VGL; the control electrode of the twentieth transistor T20 is connected with the control electrode of the twenty-first transistor T21, the first electrode of the twentieth transistor T20 is connected with the first power supply terminal VGH, and the second electrode of the twentieth transistor T20 is connected with the first output terminal OUTPUT1; the first electrode of the twenty-first transistor is connected with the first output terminal OUT- PUT1, and the second electrode of the twenty-first transistor is connected with the second power supply terminal VGL.

In the exemplary embodiment, the sixteenth transistor T16, the eighteenth transistor T18 and the twentieth transistor T20 are of the same type, the seventeenth transistor T17, the nineteenth transistor T19 and the twenty-first transistor T21 are of the same type, and the sixteenth transistor T16 and the seventeenth transistor T17 are of opposite types. FIG. 7 makes an explanation by taking, for example, the sixteenth transistor T16, the eighteenth transistor T18 and the twentieth transistor T20 as P-type thin film transistors and the seventeenth transistor T17, the nineteenth transistor T19, and the twenty-first transistor T21 as N-type thin film transistors.

The sixteenth transistor T16 and the seventeenth transistor T17 constitute an inverter, the eighteenth transistor T18 and the nineteenth transistor T19 constitute an inverter, and the twentieth transistor T20 and the twenty-first transistor T21 constitute an inverter, that is, the output buffer sub-circuit of the shift register comprises three inverters for enhancing the load-carrying capacity of the shift register.

It needs to be explained that FIG. 7 shows the exemplary structure of the output buffer sub-circuit. Those skilled in the art can readily understand that the implementation of the sub-circuit is not limited thereto, and may be any implementation as long as the respective functions can be realized.

It should be explained that the sub-transistors and transistors mentioned in the exemplary embodiments of the present disclosure are only names for transistors, and the sub-transistors are juxtaposed to the transistors, rather than subordinate to the transistors as usually understood. That is to say, the first transistor and the first sub-transistor in the exemplary embodiments of the present disclosure are in a juxtaposition relationship. Similarly, the second transistor and the second sub-transistor, the fifth transistor and the fifth sub-transistor, as well as the sixth transistor and the sixth sub-transistor are in a juxtaposition relationship.

Figure 8:
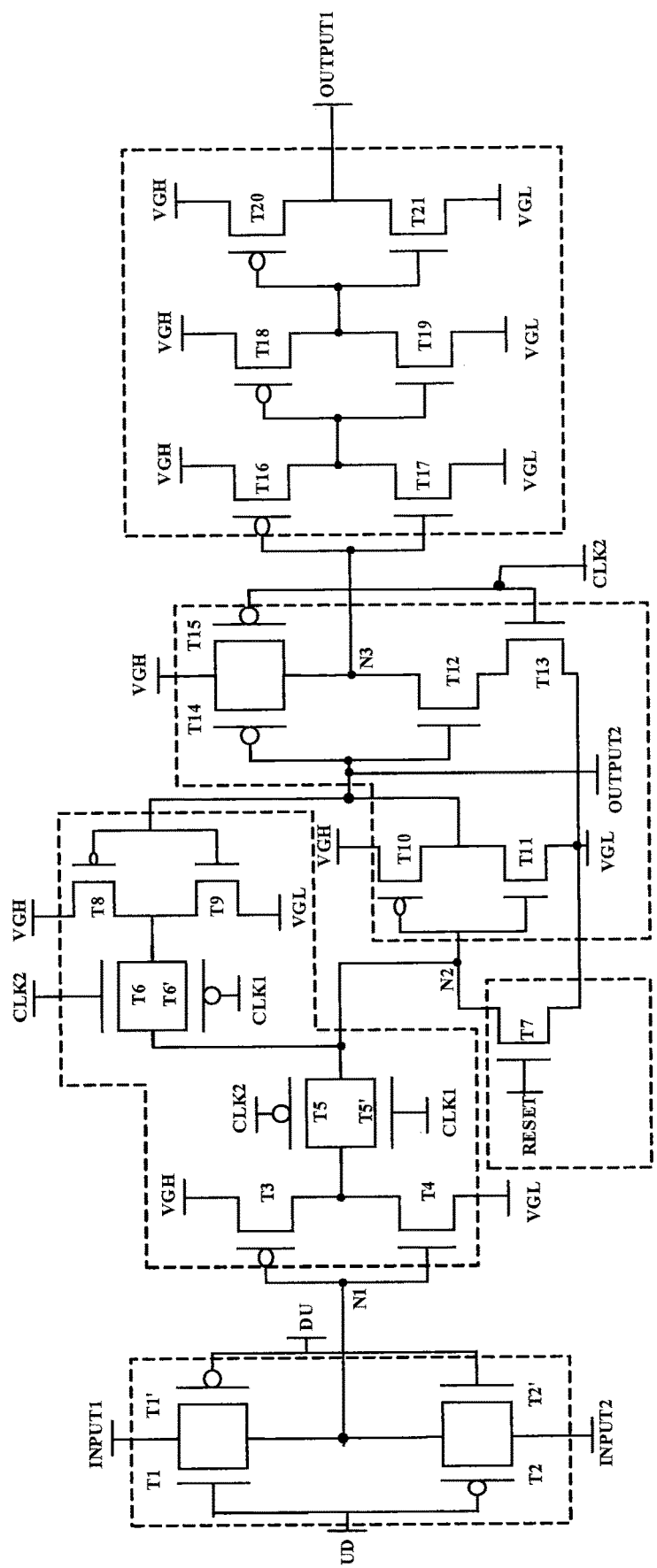
FIG. 8 is an equivalent circuit diagram of a shift register provided by an exemplary embodiment of the present disclosure.

FIG. 8 is an equivalent circuit diagram of a shift register provided by an exemplary embodiment of the present disclosure. As shown in FIG. 8, the shift register provided by the exemplary embodiment of the present disclosure may comprise a transmission sub-circuit, a storage sub-circuit, an output control sub-circuit, an output buffer sub-circuit and a reset sub-circuit. The transmission sub-circuit comprises a first transistor T1, a first sub-transistor T1', a second transistor T2, and a second sub-transistor T2'. The storage sub-circuit comprises a third transistor T3, a fourth transistor T4, a fifth transistor T5, a fifth sub-transistor T5', a sixth transistor T6, a sixth sub-transistor T6', an eighth transistor T8, and a ninth transistor T9. The output control sub-circuit comprises a tenth transistor T10, an eleventh transistor T11, a twelfth transistor T12, a thirteenth transistor T13, a fourteenth transistor T14, and a fifteenth transistor T15. The reset sub-circuit comprises a seventh transistor T7. The output buffer sub-circuit comprises a sixteenth transistor T16, a seventeenth transistor T17, an eighteenth transistor T18, a nineteenth transistor T19, a twentieth transistor T20, and a twenty-first transistor T21.

The control electrode of the first transistor T1 is connected with the first signal terminal UD, the first electrode of the first transistor T1 is connected with the first input terminal INPUT1, and the second electrode of the first transistor T1 is connected with the first node N1; the control electrode of the first sub-transistor T1' is connected with the second signal terminal DU, the first electrode of the first sub-transistor T1' is connected with the first input terminal INPUT1, and the second electrode of the first sub-transistor T1' is connected with the first node N1; the control electrode of the second transistor T2 is connected with the first signal terminal UD, the first electrode of the second transistor T2 is connected with the first node N1, and the second electrode of the second transistor T2 is connected with the second input terminal INPUT2; the control electrode of the second sub-transistor T2' is connected with the second signal terminal DU, the first electrode of the second sub-transistor T2' is connected with the second node N2, and the second electrode of the second sub-transistor T2' is connected with the second input terminal INPUT2; the control electrode of the third transistor T3 is connected with the first node N1, the first electrode of the third transistor T3 is connected with the first power supply terminal VGH, and the second electrode of the third transistor T3 is connected with the first electrode of the fourth transistor T4; the control electrode of the fourth transistor T4 is connected with the first node N1, the first electrode of the fourth transistor T4 is connected with the first electrode of the fifth transistor T5, and the second electrode of the fourth transistor T4 is connected with the second power supply terminal VGL; the control electrode of the fifth transistor T5 is connected with the second clock signal terminal CLK2, the first electrode of the fifth transistor T5 is connected with the first electrode of the fifth sub-transistor T5', and the second electrode of the fifth transistor T5 is connected with the second electrode of the fifth sub-transistor T5'; the control electrode of the fifth sub-transistor T5' is connected with the first clock signal terminal CLK1, and the second electrode of the fifth sub-transistor T5' is connected with the second node N2; the control electrode of the sixth transistor T6 is connected with the second clock signal terminal CLK2, the first electrode of the sixth transistor T6 is connected with the second node N2, and the second electrode of the sixth transistor T6 is connected with the second electrode of the eighth transistor T8; the control electrode of the sixth sub-transistor T6' is connected with the first clock signal terminal CLK1, the first electrode of the sixth sub-transistor T6' is connected with the second node N2, and the second electrode of the sixth sub-transistor T6' is connected with the second electrode of the eighth transistor T8; the control electrode of the eighth transistor T8 is connected with the second output terminal OUTPUT2, the first electrode of the eighth transistor T8 is connected with the first power supply terminal VGH, and the second electrode of the eighth transistor T8 is connected with the first electrode of the ninth transistor T9; the control electrode of the ninth transistor T9 is connected with the second output terminal OUTPUT2, and the second electrode of the ninth transistor T9 is connected with the second power supply terminal VGL; the control electrode of the tenth transistor T10 is connected with the second node N2, the first electrode of the tenth transistor T10 is connected with the first power supply terminal VGH, and the second electrode of the tenth transistor T10 is connected with the second output terminal OUTPUT2; the control electrode of the eleventh transistor T11 is connected with the second node N2, the first electrode of the eleventh transistor T11 is connected with the second output terminal OUTPUT2, and the second electrode of the eleventh transistor T11 is connected with the second power supply terminal VGL; the control electrode of the twelfth transistor T12 is connected with the second output terminal OUTPUT2, the first electrode of the twelfth transistor T12 is connected with the third node N3, and the second electrode of the twelfth transistor T12 is connected with the first electrode of the thirteenth transistor T13; the control electrode of the thirteenth transistor T13 is connected with the second clock signal terminal CLK2, and the second electrode of the thirteenth transistor T13 is connected with the second power supply terminal VGL; the control electrode of the fourteenth transistor T14 is connected with the second output terminal OUTPUT2, the first electrode of the fourteenth transistor T14 is connected with the first power supply terminal VGH, and the second electrode of the fourteenth transistor T14 is connected with the third node N3; the control electrode of the fifteenth transistor T15 is connected with the second clock signal terminal CLK2, the first electrode of the fifteenth transistor T15 is connected with the first power supply terminal VGH, and the second electrode of the fifteenth transistor T15 is connected with the third node N3; the control electrode of the seventh transistor T7 is connected with the reset signal terminal RESET, the first electrode of the seventh transistor T7 is connected with the second node N2, and the second electrode of the seventh transistor T7 is connected with the second power supply terminal VGL; the control electrode of the sixteenth transistor T16 is connected with the third node N3, the first electrode of the sixteenth transistor T16 is connected with the first power supply terminal VGH, and the second electrode of the sixteenth transistor T16 is connected with the first electrode of the seventeenth transistor T17; the control electrode of the seventeenth transistor T17 is connected with the third node N3, the first electrode of the seventeenth transistor T17 is connected with the control electrode of the eighteenth transistor T18, and the second electrode of the seventeenth transistor T17 is connected with the second power supply terminal VGL; the control electrode of the eighteenth transistor T18 is connected with the control electrode of the nineteenth transistor T19, the first electrode of the eighteenth transistor T18 is connected with the first power supply terminal VGH, and the second electrode of the eighteenth transistor T18 is connected with the first electrode of the nineteenth transistor T19; the first electrode of the nineteenth transistor T19 is connected with the control electrode of the twentieth transistor T20, and the second electrode of the nineteenth transistor T19 is connected with the second power supply terminal VGL; the control electrode of the twentieth transistor T20 is connected with the control electrode of the twenty-first transistor T21, the first electrode of the twentieth transistor T20 is connected with the first power supply terminal VGH, and the second electrode of the twentieth transistor T20 is connected with the first output terminal OUTPUT1; the first electrode of the twenty-first transistor T21 is connected with the first output terminal OUTPUT1, and the second electrode of the twenty-first transistor T21 is connected with the second power supply terminal VGL.

In the exemplary embodiment, considering that the leakage current of a low temperature polycrystalline silicon thin film transistor is small, all the transistors in the exemplary embodiments of the present disclosure may be low temperature polycrystalline silicon thin film transistors. A thin film transistor with a bottom gate structure or a top gate structure may be selected as a thin film transistor, as long as a switching function can be realized.

The technical solution of the exemplary embodiment of the present disclosure will be further explained with reference to the working process of the shift register.

Figure 9:
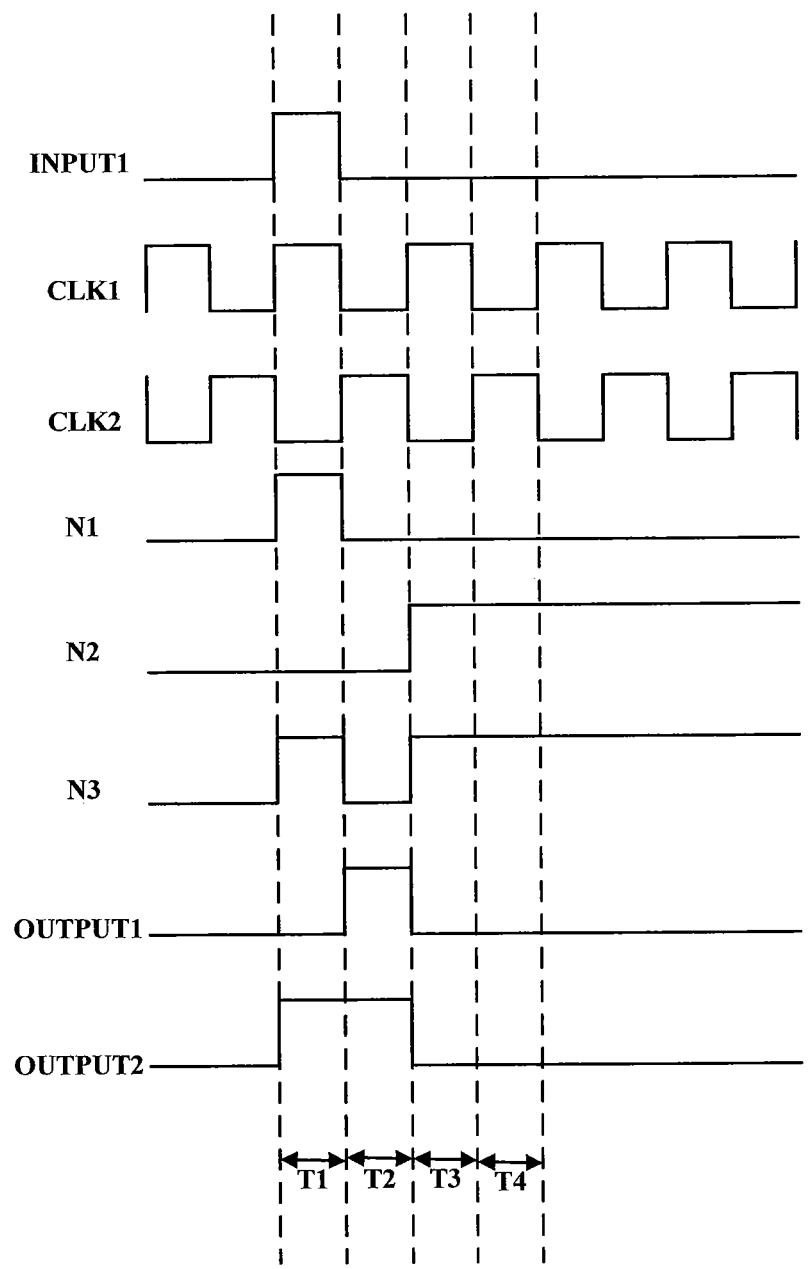
FIG. 9 is a work sequence diagram of a shift register provided by an exemplary embodiment of the present disclosure.

Take, for example, the second transistor T2, the first sub-transistor T1', the third transistor T3, the fifth transistor T5, the sixth sub-transistor T6', the eighth transistor T8, the tenth transistor T10, the fourteenth transistor T14, the fifteenth transistor T15, the sixteenth transistor T16, the eighteenth transistor T18 and the twentieth transistor T20 in the shift register provided in the exemplary embodiment of the present disclosure as P-type thin film transistors, and the first transistor T1, the second sub-transistor T2', the fourth transistor T4, the fifth sub-transistor T5', the sixth transistor T6, the seventh transistor T7, the ninth transistor T9, the eleventh transistor T11, the twelfth transistor T12, the thirteenth transistor T13, the seventeenth transistor T17, the nineteenth transistor T19 and the twenty-first transistor T21 in the shift register provided in the exemplary embodiment of the present disclosure as N-type thin film transistors. FIG. 9 is a work sequence diagram of the shift register provided by an exemplary embodiment of the present disclosure. As shown in FIGS. 8 and 9, the shift register provided by the embodiment of the present disclosure comprises twenty-first transistors, seven signal input terminals (INPUT1, INPUT2, UD, DU, CLK1, CLK2 and RESET), two signal output terminals (OUTPUT1 and OUTPUT2) and two power supply terminals (VGH and VGL).

The first power supply terminal VGH continuously provides a high potential signal. The second power supply terminal VGL continuously provides a low potential signal. The first signal terminal UD and the second signal terminal DU are switched with forward and backward scannings. In the forward scanning, the first signal terminal UD is equivalent to a high DC potential, and the second signal terminal DU is equivalent to a low DC potential. In the backward scanning, the first signal terminal UD is equivalent to a low DC potential, and the second signal terminal DU is equivalent to a high DC potential. In the exemplary embodiment of the present disclosure, the working process of the shift register is explained by taking the forward scanning for example.

In a first phase T1, namely an input phase, the signal of the first signal terminal UD is at a high potential, the first transistor T1 is turned on, the signal of the second signal terminal DU is at a low potential, the first sub-transistor T1' is turned on, the signal of the first input terminal INPUT1 is at a high potential, and the potential of the first node N1 is pulled up. Because the first node N1 is at a high potential, the fourth transistor T4 is turned on, the signal of the first clock signal terminal CLK1 is at a high potential, the fifth sub-transistor T5' is turned on, the signal of the second clock signal terminal CLK2 is at a low potential, the fifth transistor T5 is turned on, the potential of the second node N2 is pulled down to the low potential of the signal of the second power supply terminal VGL, the second node N2 is at a low potential, the tenth transistor T10 is turned on, the potential of the second output terminal OUTPUT2 is pulled up to the high potential of the signal of the first power supply terminal VGH, the second output terminal OUTPUT2 is at a high potential, the twelfth transistor T12 is turned on. Because the signal of the second clock signal terminal CLK2 is at a low potential, the fifteenth transistor T15 is turned on, the potential of the third node N3 is pulled up to the high potential of the signal of the first power supply terminal VGH. Because the third node N3 is at a high potential, the seventeenth transistor T17 is turned on, the eighteenth transistor T18 is turned on, the twenty-first transistor T21 is turned on, the first input terminal OUTPUT1 outputs the signal of the second power supply terminal VGL, and the output signal of the first output terminal OUTPUT1 is at a low potential.

In this phase, the signals of the second input terminal INPUT2, the second signal terminal DU, the second clock signal terminal CLK2 and the reset signal terminal RESET in the input terminals are all at a low potential, the signals of the first input terminal INPUT1, the first signal terminal UD and the first clock signal terminal CLK1 are all at a high potential, the output signal of the first output terminal OUTPUT1 is at a low potential, and the output signal of the second output terminal OUTPUT2 is at a high potential. Because the signal of the second output terminal OUTPUT2 is at a high potential, the ninth transistor T9 is turned on. Because the signal of the first clock signal terminal CLK1 is at a high potential, the signal of the second clock signal terminal CLK2 is at a low potential, the sixth transistor T6 and the sixth sub-transistor T6' are turned off, and the potential of the second node N2 remains unchanged.

Although the signal of the second output terminal OUTPUT2 is at a high potential, which provides the signal for the first input terminal of a shift register in the next stage, the fifth transistor T5 and the fifth sub-transistor T5' of the shift register in the next stage are turned off in this phase. Thus, the output of the shift register in the next stage will not be affected.

In the second phase T2, namely the output phase, the signal of the first input terminal INPUT1 is at a low potential, the potential of the first node N1 is pulled down, and the third transistor T3 is turned on. However, the signal of the first clock signal terminal CLK1 is at a low potential, the fifth sub-transistor T5' is turned off, the signal of the second clock signal terminal CLK2 is at a high potential and the fifth transistor T5 is turned off, so the potential of the second node N2 is not pulled up, the second node N2 remains at a low potential, the tenth transistor T10 is turned on, the signal of the second output terminal OUTPUT2 is still at a high potential, and the ninth transistor T9 is turned on. Because the signal of the first clock signal terminal CLK1 is at a low potential, the signal of the second clock signal terminal CLK2 is at a high potential, the sixth transistor T6 and the sixth sub-transistor T6' are turned on, and the second node N2 still remains at a low potential. Because the output signal of the second output terminal OUTPUT2 is at a high potential, the twelfth transistor T12 is turned on, the signal of the second clock signal terminal CLK2 is at a high potential, the thirteenth transistor T13 is turned on, and the potential of the third node N3 is pulled down to the low potential of the signal of the second power supply terminal VGL. Because the third node N3 is at a low potential, the sixteenth transistor T16 is turned on, the nineteenth transistor T19 is turned on, the twentieth transistor T20 is turned on, the first output terminal OUTPUT1 outputs the signal of the first power supply terminal VGH, and the potential of the output signal of the first output terminal OUTPUT1 is at a high potential.

In this phase, the signals of the first input terminal INPUT1, the second input terminal INPUT2, the second signal terminal DU, the first clock signal terminal CLK1 and the reset signal terminal RESET in the input terminal are all at a low potential, the first signal terminal UD and the second clock signal terminal CLK2 are at a high potential, and the output signals of the first output terminal OUTPUT1 and the second output terminal OUTPUT2 are at a high potential.

The first output terminal OUTPUT1 provides the gate drive signal for the shift register in the present stage, and the second output terminal OUTPUT2 provides the signal for the first input terminal of a shift register in the next stage.

In the third phase T3, the signal of the first input terminal INPUT1 is at a low potential, the potential of the first node N1 is pulled down, and the third transistor T3 is turned on. Because the signal of the first clock signal terminal CLK1 is at a high potential, the signal of the second clock signal terminal CLK2 is at a low potential, the fifth transistor T5 and the fifth sub-transistor T5' are turned on, and the potential of the second node N2 is pulled up to the high potential of the signal of the first power supply terminal VGH, the eleventh transistor T11 is turned on, the potential of the signal of the second output terminal OUTPUT2 is pulled down, the fourteenth transistor T14 is turned on, and the potential of the third node N3 is pulled up to the potential of the first power supply terminal VGH. Because the third node N3 is at a high potential, the seventeenth transistor T17 is turned on, the eighteenth transistor T18 is turned on, and the twenty-first transistor T21 is turned on, the signal of the second power supply terminal VGL is provided to the first input terminal OUTPUT1, and the output signal of the first input terminal OUTPUT1 is at a low potential.

In this phase, the signals of the first input terminal INPUT1, the second input terminal INPUT2, the second signal terminal DU, the second clock signal terminal CLK2 and the reset signal terminal RESET in the input terminal are all at a low potential, the first signal terminal UD and the first clock signal terminal CLK1 are at a high potential, and the output signals of the first output terminal OUTPUT1 and the second output terminal OUTPUT2 are at a low potential. Because the signal of the second output terminal OUTPUT2 is at a low potential, the eighth transistor T8 is turned on. Because the signal of the first clock signal terminal CLK1 is at a high potential, the signal of the second clock signal terminal CLK2 is at a low potential, the sixth transistor T6 and the sixth sub-transistor T6' are turned off, and the potential of the second node N2 remains unchanged.

In the fourth phase T4, the signal of the first input terminal INPUT1 is at a low potential, the potential of the first node N1 is pulled down, and the third transistor T3 is turned on. However, the signal of the first clock signal terminal CLK1 is at a low potential, the fifth sub-transistor T5' is turned off, the signal of the second clock signal terminal CLK2 is at a high potential, the fifth transistor T5 is turned off, so the second node N2 remains at a high potential, the eleventh transistor T11 is turned on, the signal of the second output terminal OUTPUT2 is still at a low potential, and the eighth transistor T8 is turned on. Because the signal of the first clock signal terminal CLK1 is at a low potential, the signal of the second clock signal terminal CLK2 is at a high potential, the sixth transistor T6 and the sixth sub-transistor T6' are turned on, and the second node N2 still remains at a high potential, the output signal of the second output terminal OUTPUT2 is at a low potential, the fourteenth transistor T14 is turned on, the signal of the second clock signal terminal CLK2 is at a high potential, the fifteenth transistor T15 is turned off, and the potential of the third node N3 is pulled up to the high potential of the signal of the first power supply terminal VGH. Because the third node N3 is at a high potential, the seventeenth transistor T17 is turned on, the eighteenth transistor T18 is turned on, the twenty-first transistor T21 is turned on, the first output terminal OUTPUT1 outputs the signal of the second power supply terminal VGL, and the output signal of the first output terminal OUTPUT1 is at a low potential.

In this phase, the signals of the first input terminal INPUT1, the second input terminal INPUT2, the second signal terminal DU, the first clock signal terminal CLK1 and the reset signal terminal RESET in the input terminal are all at a low potential, the signals of the first signal terminal UD and the second clock signal terminal CLK2 are at a high potential, and the output signals of the first output terminal OUTPUT1 and the second output terminal OUTPUT2 are at a low potential.

After the fourth phase T4, the shift register in the present stage is in the maintaining phase, i.e. it implements the third and fourth phases cyclically, until the first input terminal INPUT1 of the shift register in the present stage receives the high potential signal again.

In the exemplary embodiment, the signal of the first input terminal INPUT1 is a pulse signal, which is at a high potential only in the input phase; the output signal of the first output terminal OUTPUT1 is a pulse signal, which is at a high potential only in the output phase; the output signal of the second output terminal OUTPUT2 is a square wave signal, which is at a high potential only in the input and output phases; and the signal of the reset signal end RESET is a pulse signal, which may be at a high potential before the input phase of the shift register in the first stage or after the output phase of the shift register in the last stage.

It should be explained that the above working process is explained by taking the forward scanning for example. In the backward scanning, the first input terminal INPUT1 continuously provides a low potential signal, the second input terminal INPUT2 provides a high potential signal in the input phase, which is the same as the working process of the forward scanning and will not be reiterated herein.

The shift register provided by the exemplary embodiment of the present disclosure comprises a plurality of P-type transistors and a plurality of N-type transistors, which solve the technical problem of poor circuit stability of the shift register consisting of transistors of single type, improves touch stripes in an integrated touch and display driver, can be applied in an embedded touch panel and will not result in abnormal display due to long touch time.

Based on the inventive concept of the above embodiment, an exemplary embodiment of the present disclosure also provides a driving method of a shift register, which is applicable in the above-mentioned shift register. FIG. 10 is a flow chart of a driving method of a shift register provided by the embodiment of the present disclosure. As shown in FIG. 10, the driving method of a shift register provided by the embodiment of the present disclosure may comprise the steps of:

In Step 100, in an input phase, the transmission sub-circuit provides a signal of the first input terminal or the second input terminal to the first node under the control of the first signal terminal and the second signal terminal; the storage sub-circuit provides a signal of the first power supply terminal or the second power supply terminal to the second node under the control of the first node, the first clock signal terminal and the second clock signal terminal.

In this phase, the signals of the second input terminal, the second signal terminal, the second clock signal terminal and the reset signal terminal are at a low potential, the signals of the first input terminal, the first signal terminal and the first clock signal terminal are at a high potential, the output signal of the first output terminal is at a low potential, and the output signal of the second output terminal is at a high potential.

In Step 200, in an output phase, the storage sub-circuit maintains the potential of the second node under the control of the second output terminal, the first clock signal terminal and the second clock signal terminal, and the output control sub-circuit provides the signal of the first power supply terminal or the second power supply terminal to the second output terminal under the control of the second node, and provides the signal of the first power supply terminal or the second power supply terminal to the first output terminal under the control of the second output terminal and the second clock signal terminal.

In this phase, the signals of the first input terminal, the second input terminal, the second signal terminal, the first clock signal terminal and the reset signal terminal are at a low potential, the first signal terminal and the second clock signal terminal are at a high potential, and the output signals of the first output terminal and the second output terminal is at a high potential.

In Step 300, in a maintaining phase, the storage sub-circuit provides the signal of the first power supply terminal or the second power supply terminal to the second node under the control of the first node, the first clock signal terminal and the second clock signal terminal.

The signals of the first input terminal, the second input terminal, the second signal terminal, the second clock signal terminal and the reset signal terminal are at a low potential, the signals of the first signal terminal and the first clock signal terminal are at a high potential, and the output signals of the first output terminal and the second output terminal is at a low potential.

The driving method of the shift register provided by the exemplary embodiment of the present disclosure may comprise: in an input phase, the transmission sub-circuit provides a signal of the first input terminal or the second input terminal to the first node under the control of the first signal terminal and the second signal terminal, the storage sub-circuit provides a signal of the first power supply terminal or the second power supply terminal to the second node under the control of the first node, the first clock signal terminal and the second clock signal terminal; in an output phase, the storage sub-circuit maintains the potential of the second node under the control of the second output terminal, the first clock signal terminal and the second clock signal terminal, and the output control sub-circuit provides the signal of the first power supply terminal or the second power supply terminal to the second output terminal under the control of the second node, and provides the signal of the first power supply terminal or the second power supply terminal to the first output terminal under the control of the second output terminal and the second clock signal terminal; and in a maintaining phase, the storage sub-circuit provides the signal of the first power supply terminal or the second power supply terminal to the second node under the control of the first node, the first clock signal terminal and the second clock signal terminal. The technical solution provided by the exemplary embodiment of the present disclosure arranges the transmission sub-circuit to realize the bidirectional scanning of the shift register, and arranges the storage sub-circuit to improve the stability of the circuit, and guarantee the work stability, use reliability and display effect of a display panel.

Optionally, the driving method of the shift register provided by the exemplary embodiment of the present disclosure may further comprise: in an initialization phase, the reset sub-circuit provides the signal of the second power supply terminal to the second node under the control of the reset signal terminal.

In the exemplary embodiment of the present disclosure, the shift register in each stage is provided with the reset sub-circuit, such that the outputs of the entire gate drive circuit can be set high, thereby controlling the discharge of all the pixels.

Optionally, the driving method of the shift register provided by the exemplary embodiment of the present disclosure may further comprise: in an output phase, the output buffer sub-circuit outputs the signal of the first power supply terminal or the second power supply terminal to the first output terminal under the control of the third node.

Figure 11:
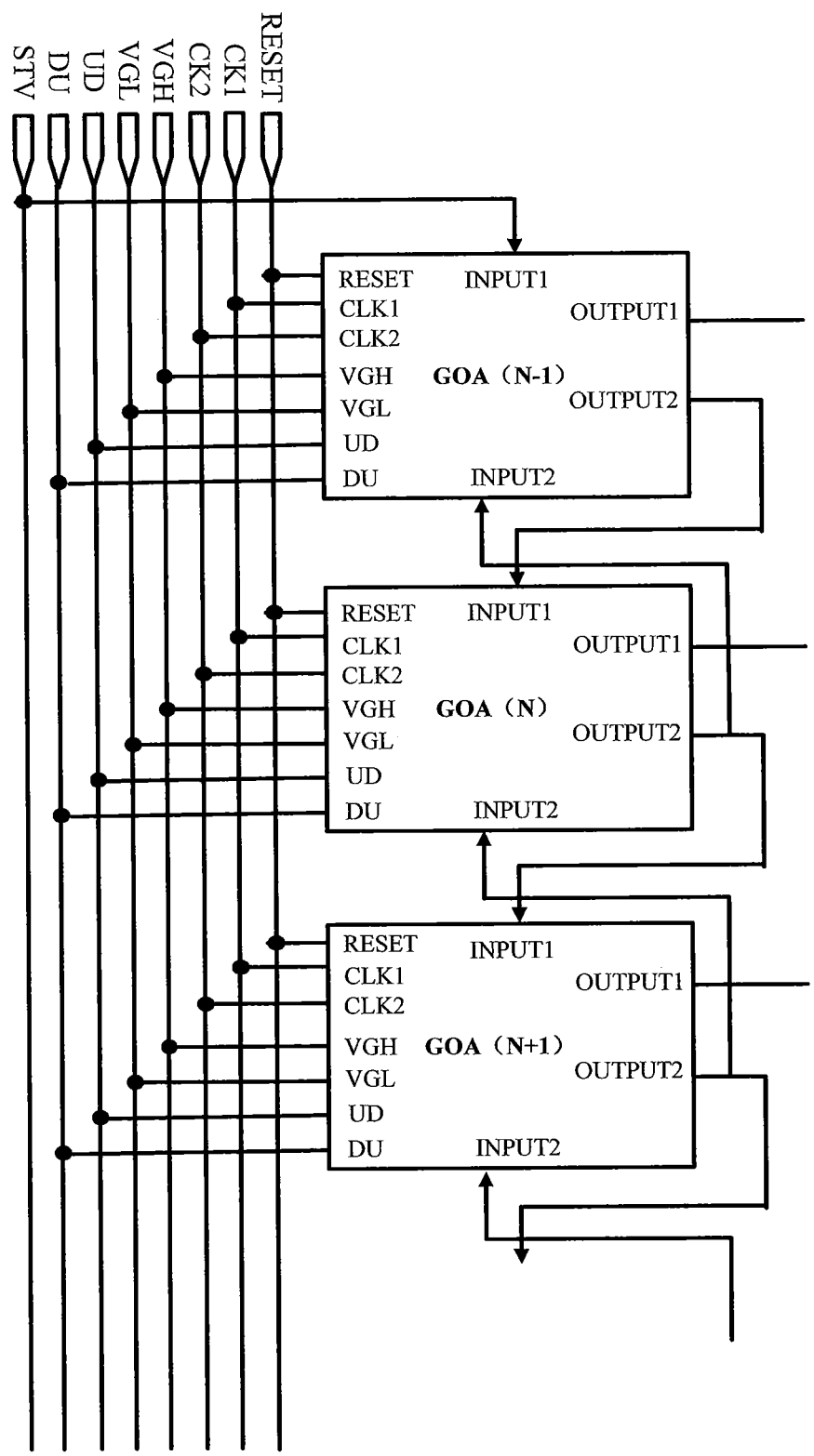
FIG. 11 is a structural schematic view of a gate drive circuit provided by an exemplary embodiment of the present disclosure.

An exemplary embodiment of the present disclosure also provides a gate drive circuit. FIG. 11 is a structural schematic view of a gate drive circuit provided by the exemplary embodiment of the present disclosure. As shown in FIG. 11, the gate drive circuit provided by the exemplary embodiment of the present disclosure may comprise a plurality of cascaded shift registers.

The first input terminal INPUT1 of an (N+1)th shift register is connected with the second output terminal OUTPUT2 of an N-th shift register, and the second output terminal OUTPUT2 of the (N+1)th shift register is connected with the second input terminal INPUT2 of the N-th shift register. The first clock signal terminal CLK1 of the N-th shift register is connected with a first clock terminal CK1, the first clock signal terminal CLK1 of the (N+1)th shift register is connected with the first clock terminal CK1, and the first clock signal terminal CLK1 of an (N−1)th shift register is connected with the first clock terminal CK1. N is a positive integer.

It shall be explained that in the forward scanning, the first input terminal INPUT1 of the shift register in the first stage is connected with an initial signal terminal STY. In the backward scanning, the second input terminal INPUT2 of the shift register in the last stage is connected with the initial signal terminal STY. FIG. 11 makes an explanation by taking the forward scanning for example.

The gate drive circuit provided by the exemplary embodiment of the present disclosure comprises the shift register provided by the exemplary embodiment of the present disclosure, with similar implementing principle and achieved effects, which will not be reiterated herein.

Figure 12:
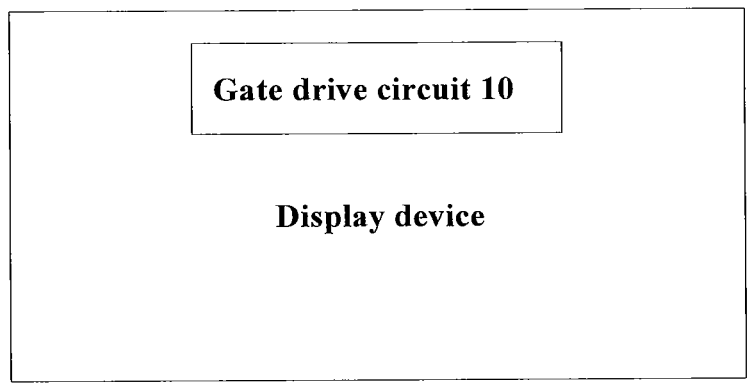
FIG. 12 is a structural schematic view of a display device provided by an exemplary embodiment of the present disclosure.

Based on the inventive concept of the above embodiment, an exemplary embodiment of the present disclosure also provides a display device. FIG. 12 is a structural schematic view of a display device provided by the exemplary embodiment of the present disclosure. The display device may comprise the gate drive circuit 10 provided by the exemplary embodiment of the present disclosure.

The gate drive circuit is the gate drive circuit provided by the exemplary embodiment of the present disclosure, with similar implementing principle and achieved effects, which will not be reiterated herein.

Explanation shall be made in the following aspects.

The drawings of the exemplary embodiments of the present disclosure only involve the structures involved in the exemplary embodiments of the present disclosure, and reference shall be made to conventional designs for other structures.

In the case of no conflict, the exemplary embodiments of the present disclosure, i.e., the features of the exemplary embodiments, may be combined with each other to obtain new embodiments.

Although the exemplary embodiments disclosed in the present disclosure are presented as above, the contents described are only the exemplary embodiments adopted to facilitate understanding the present disclosure, and are not intended to limit the present disclosure. Any technical personnel in the art to which this disclosure belongs may, without departing from the spirit and scope disclosed in this disclosure, make any modifications and changes in the form and details of its implementation. However, the scope of patent protection of this disclosure shall be determined according to the scope defined in the appended claims.

What is claimed is:

1. A shift register comprising:
a transmission sub-circuit,
a storage sub-circuit; and
an output control sub-circuit,
wherein the transmission sub-circuit is connected to a first signal terminal, a second signal terminal, a first input terminal, a second input terminal and a first node, and is configured to provide a signal of the first input terminal or the second input terminal to the first node under control of the first signal terminal and the second signal terminal,
wherein the storage sub-circuit is connected to the first node, a second node, a first power supply terminal, a second power supply terminal, a first clock signal terminal and a second clock signal terminal, and is configured to provide a signal of the first power supply terminal or the second power supply terminal to the second node under control of the first node, the first clock signal terminal and the second clock signal terminal, and maintain potential of the second node under control of a second output terminal, the first clock signal terminal and the second clock signal terminal, and
wherein the output control sub-circuit is connected to the second node, the first power supply terminal, the second power supply terminal, the second clock signal terminal, a first output terminal and the second output terminal, and is configured to provide a signal of the first power supply terminal or the second power supply terminal to the second output terminal under control of the second node, and provide a signal of the first power supply terminal or the second power supply terminal to the first output terminal under control of the second output terminal and the second clock signal terminal.

2. The shift register according to claim 1, further comprising:
an output buffer sub-circuit; and
a reset sub-circuit,
wherein the output buffer sub-circuit is connected to a third node, the first output terminal, the first power supply terminal and the second power supply terminal, and is configured to output a signal of the first power supply terminal or the second power supply terminal to the first output terminal under control of the third node,
wherein the output buffer sub-circuit is connected to the output control sub-circuit through the third node, and
wherein the reset sub-circuit is connected to the second node, the second power supply terminal and a reset signal terminal, and is configured to provide a signal of the second power supply terminal to the second node under control of the reset signal terminal.

3. The shift register according to claim 2,
wherein the reset sub-circuit comprises a seventh transistor, and
wherein a control electrode of the seventh transistor is connected to the reset signal terminal, a first electrode of the seventh transistor is connected to the second node, and a second electrode of the seventh transistor is connected to the second power supply terminal.

4. A gate drive circuit comprising a plurality of cascaded shift registers according to claim 3,
wherein a first input terminal of an (N+1)th shift register is connected to a second output terminal of an N-th shift register, and a second output terminal of the (N+1)th shift register is connected to a second input terminal of the N-th shift register, and
wherein N is a positive integer.

5. The shift register according to claim 2, wherein the output buffer sub-circuit comprises:
a sixteenth transistor;
a seventeenth transistor;

an eighteenth transistor;
a nineteenth transistor;
a twentieth transistor; and
a twenty-first transistor,
wherein a control electrode of the sixteenth transistor is connected to the third node, a first electrode of the sixteenth transistor is connected to the first power supply terminal, and a second electrode of the sixteenth transistor is connected to a first electrode of the seventeenth transistor,
wherein a control electrode of the seventeenth transistor is connected with the third node, the first electrode of the seventeenth transistor is connected to a control electrode of the eighteenth transistor, and a second electrode of the seventeenth transistor is connected to the second power supply terminal,
wherein the control electrode of the eighteenth transistor is connected to a control electrode of the nineteenth transistor, a first electrode of the eighteenth transistor is connected to the first power supply terminal, and a second electrode of the eighteenth transistor is connected to a first electrode of the nineteenth transistor,
wherein the first electrode of the nineteenth transistor is connected to a control electrode of the twentieth transistor, and a second electrode of the nineteenth transistor is connected to the second power supply terminal,
wherein the control electrode of the twentieth transistor is connected to a control electrode of the twenty-first transistor, a first electrode of the twentieth transistor is connected to the first power supply terminal, and a second electrode of the twentieth transistor is connected to the first output terminal,
wherein a first electrode of the twenty-first transistor is connected to the first output terminal, and a second electrode of the twenty-first transistor is connected to the second power supply terminal, and
wherein the sixteenth transistor, the eighteenth transistor, and the twentieth transistor are of a same conductivity type, the seventeenth transistor, the nineteenth transistor, and the twenty-first transistor are of a same conductivity type, and the sixteenth transistor and the seventeenth transistor are of opposite conductivity types.

6. A gate drive circuit comprising a plurality of cascaded shift registers according to claim 5,
wherein a first input terminal of an (N+1)th shift register is connected to a second output terminal of an N-th shift register, and a second output terminal of the (N+1)th shift register is connected to a second input terminal of the N-th shift register, and
wherein N is a positive integer.

7. A gate drive circuit comprising a plurality of cascaded shift registers according to claim 2,
wherein a first input terminal of an (N+1)th shift register is connected to a second output terminal of an N-th shift register, and a second output terminal of the (N+1)th shift register is connected to a second input terminal of the N-th shift register, and
wherein N is a positive integer.

8. The shift register according to claim 1,
wherein the transmission sub-circuit comprises a first transistor, a first sub-transistor, a second transistor and a second sub-transistor,
wherein a control electrode of the first transistor is connected to the first signal terminal, a first electrode of the first transistor is connected to the first input terminal, and a second electrode of the first transistor is connected to the first node,
wherein a control electrode of the first sub-transistor is connected to the second signal terminal, a first electrode of the first sub-transistor is connected to the first input terminal, and a second electrode of the first sub-transistor is connected to the first node,
wherein a control electrode of the second transistor is connected to the first signal terminal, a first electrode of the second transistor is connected to the first node, and a second electrode of the second transistor is connected to the second input terminal,
wherein a control electrode of the second sub-transistor is connected to the second signal terminal, a first electrode of the second sub-transistor is connected to the second node, and a second electrode of the second sub-transistor is connected to the second input terminal, and
wherein the first transistor and the first sub-transistor are of opposite conductivity types, the first transistor and the second sub-transistor are of a same conductivity type, and the second transistor and the first sub-transistor are of a same conductivity type.

9. A gate drive circuit comprising a plurality of cascaded shift registers according to claim 8,
wherein a first input terminal of an (N+1)th shift register is connected to a second output terminal of an N-th shift register, and a second output terminal of the (N+1)th shift register is connected to a second input terminal of the N-th shift register, and
wherein N is a positive integer.

10. The shift register according to claim 1,
wherein the storage sub-circuit comprises: a third transistor, a fourth transistor, a fifth transistor, a fifth sub-transistor, a sixth transistor, a sixth sub-transistor, an eighth transistor, and a ninth transistor, and
wherein a control electrode of the third transistor is connected to the first node, a first electrode of the third transistor is connected to the first power supply terminal, and a second electrode of the third transistor is connected to a first electrode of the fourth transistor,
wherein a control electrode of the fourth transistor is connected to the first node, a first electrode of the fourth transistor is connected to a first electrode of the fifth transistor, and a second electrode of the fourth transistor is connected to the second power supply terminal,
wherein a control electrode of the fifth transistor is connected to the second clock signal terminal, a first electrode of the fifth transistor is connected to a first electrode of the fifth sub-transistor, and a second electrode of the fifth transistor is connected to a second electrode of the fifth sub-transistor,
wherein a control electrode of the fifth sub-transistor is connected to the first clock signal terminal, and a second electrode of the fifth sub-transistor is connected to the second node,
wherein a control electrode of the sixth transistor is connected to the second clock signal terminal, a first electrode of the sixth transistor is connected to the second node, and a second electrode of the sixth transistor is connected to a second electrode of the eighth transistor,
wherein a control electrode of the sixth sub-transistor is connected to the first clock signal terminal, a first electrode of the sixth sub-transistor is connected to the second node, and a second electrode of the sixth sub-transistor is connected to the second electrode of the eighth transistor, wherein a control electrode of the eighth transistor is connected to the second output terminal, a first electrode of the eighth transistor is connected to the first power supply terminal, and a second electrode of the eighth transistor is connected to a first electrode of the ninth transistor, wherein a control electrode of the ninth transistor is connected to the second output terminal, and a second electrode of the ninth transistor is connected to the second power supply terminal, and wherein the fifth transistor and the fifth sub-transistor are of opposite conductivity types, the fifth transistor and the sixth sub-transistor are of a same conductivity type, the sixth transistor and the fifth sub-transistor are of a same conductivity type, the third transistor and the fourth transistor are of opposite conductivity types, and the eighth transistor and the ninth transistor are of opposite conductivity types.

11. A gate drive circuit comprising a plurality of cascaded shift registers according to claim 10, wherein a first input terminal of an (N+1)th shift register is connected to a second output terminal of an N-th shift register, and a second output terminal of the (N+1)th shift register is connected to a second input terminal of the N-th shift register, and wherein N is a positive integer.

12. The shift register according to claim 1, wherein the output control sub-circuit comprises a tenth transistor, an eleventh transistor, a twelfth transistor, a thirteenth transistor, a fourteenth transistor, and a fifteenth transistor, and wherein a control electrode of the tenth transistor is connected to the second node, a first electrode of the tenth transistor is connected to the first power supply terminal, and a second electrode of the tenth transistor is connected to the second output terminal, wherein a control electrode of the eleventh transistor is connected to the second node, a first electrode of the eleventh transistor is connected to the second output terminal, and a second electrode of the eleventh transistor is connected to the second power supply terminal, wherein a control electrode of the twelfth transistor is connected to the second output terminal, a first electrode of the twelfth transistor is connected to the first output terminal, and a second electrode of the twelfth transistor is connected to a first electrode of the thirteenth transistor, wherein a control electrode of the thirteenth transistor is connected to the second clock signal terminal, and a second electrode of the thirteenth transistor is connected to the second power supply terminal, wherein a control electrode of the fourteenth transistor is connected to the second output terminal, a first electrode of the fourteenth transistor is connected to the first power supply terminal, and a second electrode of the fourteenth transistor is connected to the first output terminal, wherein a control electrode of the fifteenth transistor is connected to the second clock signal terminal, a first electrode of the fifteenth transistor is connected to the first power supply terminal, and a second electrode of the fifteenth transistor is connected to the first output terminal, and wherein the tenth transistor and the eleventh transistor are of opposite conductivity types, the fourteenth transistor and the fifteenth transistor are of a same conductivity type, the twelfth transistor and the thirteenth transistor are of a same conductivity type, and the twelfth transistor and the fourteenth transistor are of opposite conductivity types.

13. A gate drive circuit comprising a plurality of cascaded shift registers according to claim 12, wherein a first input terminal of an (N+1)th shift register is connected to a second output terminal of an N-th shift register, and a second output terminal of the (N+1)th shift register is connected to a second input terminal of the N-th shift register, and wherein N is a positive integer.

14. The shift register according to claim 1, further comprising:

an output buffer sub-circuit; and a reset sub-circuit, and wherein the transmission sub-circuit comprises a first transistor, a first sub-transistor, a second transistor, and a second sub-transistor, the storage sub-circuit comprises a third transistor, a fourth transistor, a fifth transistor, a fifth sub-transistor, a sixth transistor, a sixth sub-transistor, an eighth transistor, and a ninth transistor, the output control sub-circuit comprises a tenth transistor, an eleventh transistor, a twelfth transistor, a thirteenth transistor, a fourteenth transistor, and a fifteenth transistor, the reset sub-circuit comprises a seventh transistor, the output buffer sub-circuit comprises a sixteenth transistor, a seventeenth transistor, an eighteenth transistor, a nineteenth transistor, a twentieth transistor, and a twenty-first transistor, wherein a control electrode of the first transistor is connected to the first signal terminal, a first electrode of the first transistor is connected to the first input terminal, and a second electrode of the first transistor is connected to the first node, wherein a control electrode of the first sub-transistor is connected to the second signal terminal, a first electrode of the first sub-transistor is connected to the first input terminal, and a second electrode of the first sub-transistor is connected to the first node, wherein a control electrode of the second transistor is connected to the first signal terminal, a first electrode of the second transistor is connected to the first node, and a second electrode of the second transistor is connected to the second input terminal, wherein a control electrode of the second sub-transistor is connected to the second signal terminal, a first electrode of the second sub-transistor is connected to the second node, and a second electrode of the second sub-transistor is connected to the second input terminal, wherein a control electrode of the third transistor is connected to the first node, a first electrode of the third transistor is connected to the first power supply terminal, and a second electrode of the third transistor is connected to a first electrode of the fourth transistor, wherein a control electrode of the fourth transistor is connected to the first node, the first electrode of the fourth transistor is connected to a first electrode of the fifth transistor, and a second electrode of the fourth transistor is connected to the second power supply terminal, wherein a control electrode of the fifth transistor is connected to the second clock signal terminal, a first electrode of the fifth transistor is connected to a first electrode of the fifth sub-transistor, and a second electrode of the fifth transistor is connected to a second electrode of the fifth sub-transistor, wherein a control electrode of the fifth sub-transistor is connected to the first clock signal terminal, and the second electrode of the fifth sub-transistor is connected to the second node, wherein a control electrode of the sixth transistor is connected to the second clock signal terminal, a first electrode of the sixth transistor is connected to the second node, and a second electrode of the sixth transistor is connected to a second electrode of the eighth transistor, wherein a control electrode of the sixth sub-transistor is connected to the first clock signal terminal, a first electrode of the sixth sub-transistor is connected to the second node, and a second electrode of the sixth sub-transistor is connected to the second electrode of the eighth transistor, wherein a control electrode of the eighth transistor is connected to the second output terminal, a first electrode of the eighth transistor is connected to the first power supply terminal, and the second electrode of the eighth transistor is connected to a first electrode of the ninth transistor, wherein a control electrode of the ninth transistor is connected to the second output terminal, and a second electrode of the ninth transistor is connected to the second power supply terminal, wherein a control electrode of the tenth transistor is connected to the second node, a first electrode of the tenth transistor is connected to the first power supply terminal, and a second electrode of the tenth transistor is connected to the second output terminal, wherein a control electrode of the eleventh transistor is connected to the second node, a first electrode of the eleventh transistor is connected to the second output terminal, and a second electrode of the eleventh transistor is connected to the second power supply terminal, wherein a control electrode of the twelfth transistor is connected to the second output terminal, a first electrode of the twelfth transistor is connected to a third node, and a second electrode of the twelfth transistor is connected to a first electrode of the thirteenth transistor, wherein a control electrode of the thirteenth transistor is connected to the second clock signal terminal, and a second electrode of the thirteenth transistor is connected to the second power supply terminal, wherein a control electrode of the fourteenth transistor is connected to the second output terminal, a first electrode of the fourteenth transistor is connected to the first power supply terminal, and a second electrode of the fourteenth transistor is connected to the third node, wherein a control electrode of the fifteenth transistor is connected to the second clock signal terminal, a first electrode of the fifteenth transistor is connected to the first power supply terminal, and a second electrode of the fifteenth transistor is connected to the third nod, wherein a control electrode of the seventh transistor is connected to a reset signal terminal, a first electrode of the seventh transistor is connected to the second node, and a second electrode of the seventh transistor is connected to the second power supply terminal, wherein a control electrode of the sixteenth transistor is connected to the third node, a first electrode of the sixteenth transistor is connected to the first power supply terminal, and a second electrode of the sixteenth transistor is connected to a first electrode of the seventeenth transistor, wherein a control electrode of the seventeenth transistor is connected to the third node, the first electrode of the seventeenth transistor is connected to a control electrode of the eighteenth transistor, and a second electrode of the seventeenth transistor is connected to the second power supply terminal, wherein the control electrode of the eighteenth transistor is connected to a control electrode of the nineteenth transistor, a first electrode of the eighteenth transistor is connected to the first power supply terminal, and a second electrode of the eighteenth transistor is connected to a first electrode of the nineteenth transistor, wherein the first electrode of the nineteenth transistor is connected to a control electrode of the twentieth transistor, and a second electrode of the nineteenth transistor is connected to the second power supply terminal, wherein the control electrode of the twentieth transistor is connected to a control electrode of the twenty-first transistor, a first electrode of the twentieth transistor is connected to the first power supply terminal, and a second electrode of the twentieth transistor is connected to the first output terminal, and wherein a first electrode of the twenty-first transistor is connected to the first output terminal, and a second electrode of the twenty-first transistor is connected to the second power supply terminal.

15. A gate drive circuit comprising a plurality of cascaded shift registers according to claim 14,
wherein a first input terminal of an (N+1)th shift register is connected to a second output terminal of an N-th shift register, and a second output terminal of the (N+1)th shift register is connected to a second input terminal of the N-th shift register, and
wherein N is a positive integer.

16. A gate drive circuit comprising a plurality of cascaded shift registers according to claim 1,
wherein a first input terminal of an (N+1)th shift register is connected to a second output terminal of an N-th shift register, and a second output terminal of the (N+1)th shift register is connected to a second input terminal of the N-th shift register, and
wherein N is a positive integer.

17. A display device comprising the gate drive circuit according to claim 16.

18. A driving method of a shift register applied to the shift register according to claim 1, the method comprising:
in an input phase, the transmission sub-circuit providing a signal of the first input terminal or the second input terminal to the first node under control of the first signal terminal and the second signal terminal, the storage sub-circuit provides a signal of a first power supply terminal or a second power supply terminal to the second node under control of the first node, the first clock signal terminal and the second clock signal terminal;
in an output phase, the storage sub-circuit maintaining the potential of the second node under control of the second output terminal, the first clock signal terminal and the second clock signal terminal, and the output control sub-circuit provides the signal of the first power supply terminal or the second power supply terminal to the second output terminal under control of the second node, and provides the signal of the first power supply terminal or the second power supply terminal to the first output terminal under control of the second output terminal and the second clock signal terminal; and in a maintaining phase, the storage sub-circuit providing the signal of the first power supply terminal or the second power supply terminal to the second node under control of the first node, the first clock signal terminal and the second clock signal terminal.

19. The driving method according to claim 18, further comprising:

in an initialization phase, a reset sub-circuit providing the signal of the second power supply terminal to the second node under control of a reset signal terminal.

20. The driving method according to claim 18, further comprising:

in an output phase, an output buffer sub-circuit outputting the signal of the first power supply terminal or the second power supply terminal to the first output terminal under control of a third node.

* * * * *